United States Patent [19]
Kang

[11] Patent Number: 6,118,687
[45] Date of Patent: Sep. 12, 2000

[54] NONVOLATILE FERROELECTRIC MEMORY WITHOUT A SEPARATE CELL PLATE LINE AND METHOD OF MANUFACTURING THE SAME

[75] Inventor: Hee Bok Kang, Daejeon-si, Rep. of Korea

[73] Assignee: LG Semicon Co., Ltd., Cheongju, Rep. of Korea

[21] Appl. No.: 09/055,985

[22] Filed: Apr. 7, 1998

[30] Foreign Application Priority Data

Dec. 12, 1997 [KR] Rep. of Korea ............ 97/68192

[51] Int. Cl.[7] .................................................. G11C 11/22
[52] U.S. Cl. ............... 365/145; 365/185.08; 365/185.23; 365/189.01
[58] Field of Search ............... 365/145, 185.08, 365/185.23, 189.01

[56] References Cited

U.S. PATENT DOCUMENTS

| | | | |
|---|---|---|---|
| 4,433,390 | 2/1984 | Carp et al. | 364/900 |
| 4,873,664 | 10/1989 | Eaton, Jr. | 365/145 |
| 4,888,630 | 12/1989 | Paterson | 357/23.5 |
| 4,928,095 | 5/1990 | Kawahara | 340/784 |
| 5,371,699 | 12/1994 | Larson | 365/145 |
| 5,608,667 | 3/1997 | Osawa | 365/145 |
| 5,638,318 | 6/1997 | Seyyedy | 365/145 |
| 5,680,344 | 10/1997 | Seyyedy | 365/145 |
| 5,917,746 | 6/1999 | Seyyedy | 365/145 |

*Primary Examiner*—David Nelms
*Assistant Examiner*—Tuan T. Nguyen
*Attorney, Agent, or Firm*—Fleshner & Kim

[57] ABSTRACT

A nonvolatile ferroelectric memory having a pair of split word lines rather than a word line and a plate line simplifies the manufacturing process and allows high density integration. The memory includes a first and second transistors, each having a source, a drain and a gate. The gate of the first and second transistors are coupled to the corresponding split word lines. A first ferroelectric capacitor has an electrode connected to the source of the first transistor and the other electrode is connected to one of the split word lines coupled to the gate of the first transistor. A second ferroelectric capacitor has an electrode connected to the source of the second transistor and the other electrode is connected to the other split word line which is coupled to the first of the second transistor.

33 Claims, 29 Drawing Sheets

E : electric field
Q : residual polarization

C1 : zero state
C2 : one state

NONVOLATILE FERROELECTRIC MEMORY WITHOUT A SEPARATE CELL PLATE LINE AND METHOD OF MANUFACTURING THE SAME

BACKGROUND OF THE INVENTION

1. Field of the Invention

The present invention relates to a memory and method of manufacturing the same, more particularly, to a ferroelectric memory and a method of making the same.

2. Discussion of the Related Art

Ferroelectric random access memory (FRAM) having data processing speed as fast as DRAM, which is generally used as semiconductor memories and keeping the stored data when a supplied power is off, is getting attention in the memory of next generation. The FRAM is a memory device having almost the same structure as the DRAM but the data stored in the memory is not lost when electric field is lost from the memory because a ferroelectric having a characteristic of a high residual polarization is used as the material of its capacitor.

In other words, as shown in the hysteresis loop of FIG. 1, a polarization induced by an electric field is not vanished because of the existence of its spontaneous polarization even though the electric field is removed but maintains a constant state (d and a states). This device is used as a memory by corresponding the d and a states to 1 and 0, respectively. Such device is described in U.S. Pat. No. 4,873,644 to Eaton, Jr.

FIG. 2 is circuitry of a background art ferroelectric memory, and FIG. 3 is a timing waveform to explain the operation of the background art ferroelectric memory. An ideal structure of FRAM having a ferroelectric thin film is provided with one transistor and one capacitor (1T/1C) which is similar to DRAM, but it has a serious problem in providing a high degree of integration which is difficult to be solved if new electrode and barrier materials are not invented. The problem in the high degree of integration is that the capacitor cannot be directly formed on a silicon substrate or on a polysilicon, and therefore the size of the memory is larger than the DRAM of the same size. Furthermore, if the electric field is repeatedly applied to the ferroelectric, a fatigue phenomenon having a gradually decreased residual polarization occurs and a problem of reliability of the memory remains.

In order to replace the FRAM having such problems, FRAM of 2T/2C (two transistors and two capacitors) shown in FIG. 2 is suggested under consideration of all practical matters (substitute electrode material, integration, stability of an ferroelectric thin film, reliability of operation, etc.). The FRAM of 2T/2C is provided with first and second transistors (T1, T2) 1 and 3 whose gates are commonly connected to a word line 5 and first and second ferroelectric capacitors (C1, C2) 2 and 4. A drain and a source of the first transistor 1 are connected to a bit line 6 and a node (N1), respectively, and a drain and a source of the second transistor 3 are connected to a /bit line 7 and a node (N2), respectively. The first ferroelectric capacitor 2 is connected between the node (N1) and a cell plate line (CPL) 8, and the second ferroelectric capacitor 4 is connected between the node (N2) and the cell plate line (CPL) 8.

The operation of the 2T/2C FRAM is explained hereafter. As shown in the timing waveform of FIG. 3, if a signal applied to the word line 5 in the time interval T1 is enabled from low to high, all selected cells are conducted between the bit line 6 and the /bit line 7. In this state, if a signal applied to the word line 5 is enabled from low to high, the memory cell data is transferred to the bit line 6 and the /bit line 7. A sense amplifier senses the signal, amplifies it and then feeds the amplified signal back to the bit line 6 and /bit line 7. If it is required that the destroyed data of the first and second ferroelectric capacitors 2 and 4 are recovered, the potential of the word line 5 is kept a high state and the potential of cell plate line 8 is disabled from a high state to a low state. Then, the destroyed data are restored.

The structure of the background art 2T/2C FRAM and its manufacturing method are explained in the following. FIG. 4 is a cross sectional view of a background art ferroelectric memory, and FIGS. 5a to 5i are the cross sectional views of the manufacturing process of the background art ferroelectric memory. This background art FRAM is provided with a gate electrode 42 formed on a semiconductor substrate 41, source/drain regions 43 formed in the semiconductor substrate 41 on both sides of the gate electrode 42. A lower electrode layer 44 is in contact with one of the source/drain regions; a ferroelectric layer 45 is formed on the lower electrode layer 44 of the capacitor; and an upper electrode layer 46 of the capacitor is formed on said ferroelectric layer 45. The bit line and /bit line 47 is in contact with the other source/drain regions 43, and a cell plate line 48 is in contact with the upper electrode layer 46 of the capacitor. First, second and third insulation layers 49, 50, and 51 are formed for isolation.

The manufacturing process for the background art ferroelectric memory is as follows. As shown in FIG. 5a, a field oxide layer 51 formed in the element isolation region of the semiconductor substrate 50 defines as an active region in which the first and second transistors 1 and 3 are to be formed. Referring to FIG. 5b, a gate line 53 of each of the first and second transistors is formed in the active region 52 defined by the field oxide layer 51 of each transistor.

Referring to FIG. 5c, by an impurity ion injection process using the gate line 53 as a mask, the source/drain 54 of the first and second transistors 1 and 3 is formed. Referring to FIG. 5d, a first insulation layer 55 is formed on the whole surface, and a first insulation layer 55 on one of source/drain region 54 of the first and second transistors 1 and 3 is selectively removed where the first contact hole 56 is to be formed. Referring to FIG. 5e, a lower electrode material layer 57 is formed so that the first contact hole 56 is buried, and on the lower electrode material layer 57, a ferroelectric layer 58 and an upper electrode material layer 59 are formed in sequence. The upper electrode material layer 59, ferroelectric layer 58 and lower electrode material layer 57 are selectively etched and therein the first and second ferroelectric capacitors 2 and 4 are formed.

Referring to FIG. 5f, a second insulation layer 60 is formed on the surface of the semiconductor substrate 50 on which the first and second ferroelectric capacitors 2 and 4 are formed. The second insulation layer 60 on the other side of the source/drain region 54 of the first and second transistors 1 and 3 is selectively removed, and thereat, a second contact hole 61 is formed. Referring to FIG. 5g, by completely burying the second contact hole 61, the bit line and /bit line 62, which are in contact with the other source/drain region 54 of the first and second transistors 1 and 3, are formed.

Referring to FIG. 5h, a third insulation layer 63 is formed on the surface on which the bit line and /bit line 62 are formed. The second insulation layer 60 and the third insulation layer 63 on the upper side of the ferroelectric capacitor are selectively removed and thereat a third contact hole 64 is formed. A third contact hole 64, which is to connect the upper electrode material layer 59 of the capacitor with a cell plate line which is to be formed. Referring to FIG. 5i, a cell plate line 65 is formed so that the line is in contact with the upper electrode material layer 59 and the third contact hole 65 is completely filled up. Thus, the background art 2T/2C FRAM has a speed as high as DRAM but keeps the stored data even when the power is lost.

Although the background art FRAM has a merit of keeping the stored data when the power is lost, the layout of the background art FRAM is difficult because of its separate cell plate line, and therefore the manufacturing process is complicated and the cost increases greatly. Furthermore, the control for a read or write mode operation is also difficult, and therefore, the efficiency as a memory is decreased.

SUMMARY OF THE INVENTION

Accordingly, the present invention is directed to solve these and other problems of the background art FRAM.

It is an object of the present invention to provide a nonvolatile ferroelectric memory and method of manufacturing the same which have at least one of the advantages of high degree of integration and the simplification of the manufacturing process.

It is another object of the present invention to implement a ferroelectric memory without a separate cell plate line.

These objectives and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

To achieve these and other advantages and in accordance with the purpose of the present invention, as embodied and broadly described, a nonvolatile ferroelectric memory according to the present invention includes: a first transistor having a source, a drain and a gate connected with one of word line, a first ferroelectric capacitor whose one electrode is connected with the source of the first transistor and the other electrode is connected with another word line, a second transistor having a source, a drain and a gate connected with the word line with which said first ferroelectric capacitor is connected, and a second ferroelectric capacitor whose one electrode is connected with the source of the second transistor and the other electrode is connected with the word line with which the gate of the first transistor is connected.

The method of manufacturing the memory according to the present invention includes the steps of: forming first and second gate lines and lower electrodes of first and second capacitors in the region defined by an element isolation region of the semiconductor substrate, forming first and second source/drain regions by impurity ion injection process using the first and second gate lines and the lower electrodes of first second capacitors as a mask, forming first contact hole by forming a ferroelectric layer on the lower electrode of each of the first and second capacitors by forming a first insulation layer on the front surface and by selectively removing the insulation layer, forming upper electrode of each of the first and second capacitors connected with one of each of the first and second source/drain regions through the first contact hole, forming a second contact hole by forming an insulation layer on the surface and by selectively removing the insulation layer so that a part of each of the first and second source/drain regions is exposed, and forming metal lines which is connected with the first and second source/drain regions through the second contact hole.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the preferred embodiments of the invention.

DETAILED DESCRIPTION OF THE PREFERRED EMBODIMENT

Figure 6A:
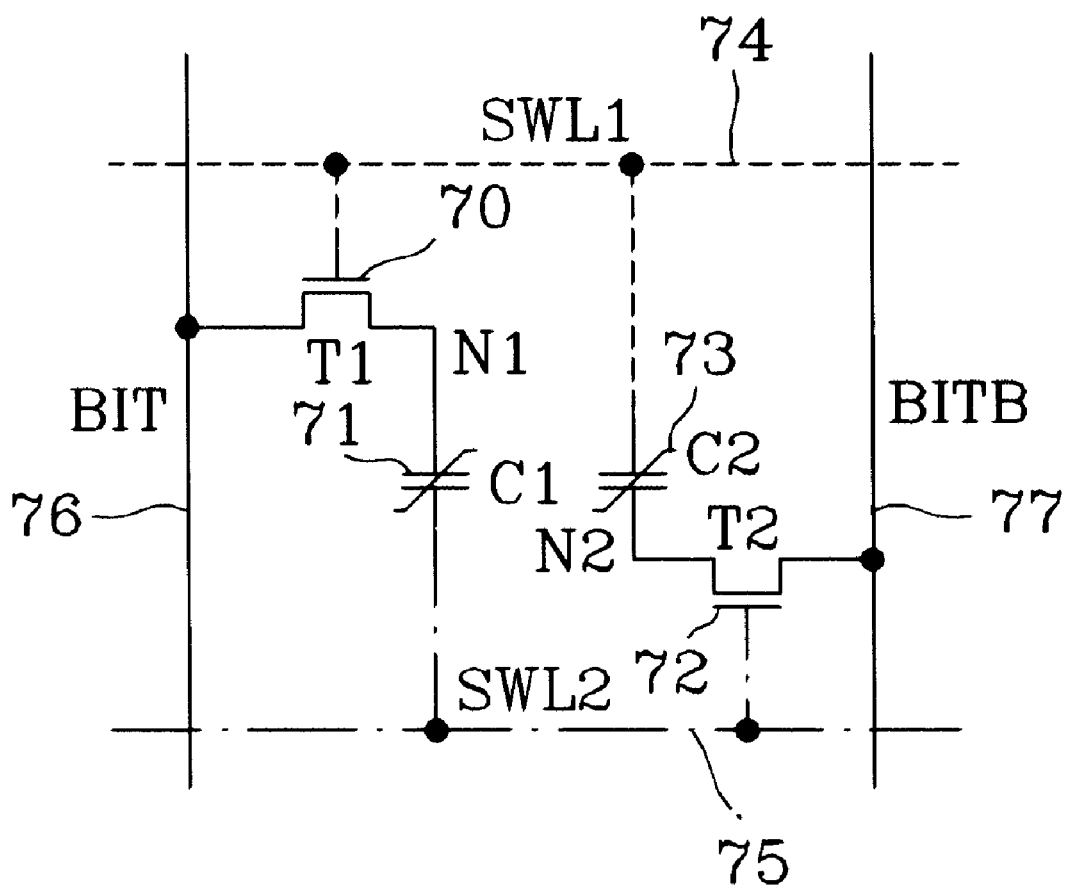
FIGS. 6a to 6c are a circuit diagram and cell array structures of a ferroelectric memory in a preferred embodiment of the present invention.
Figure 6B:
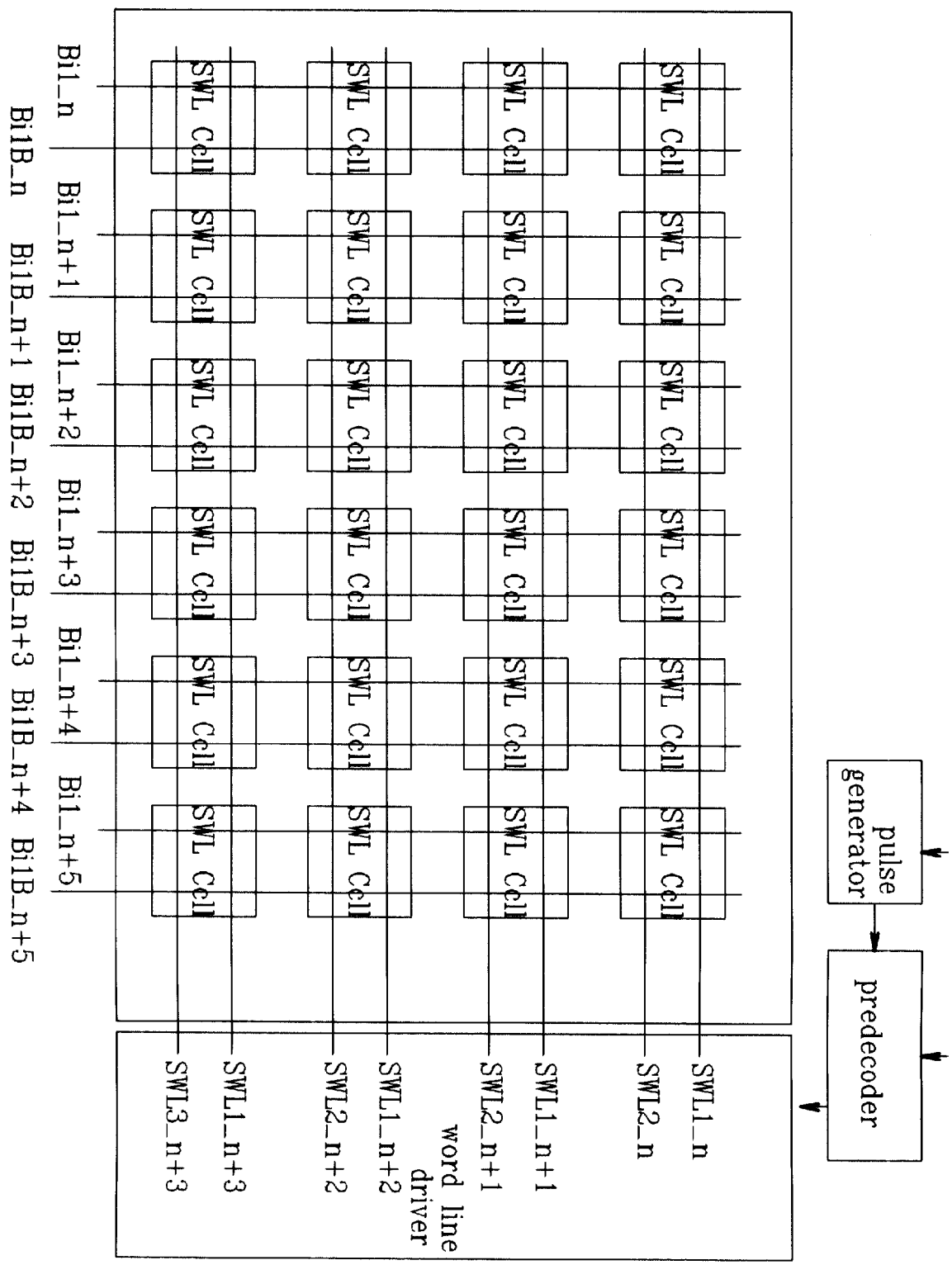
Figure 6C:
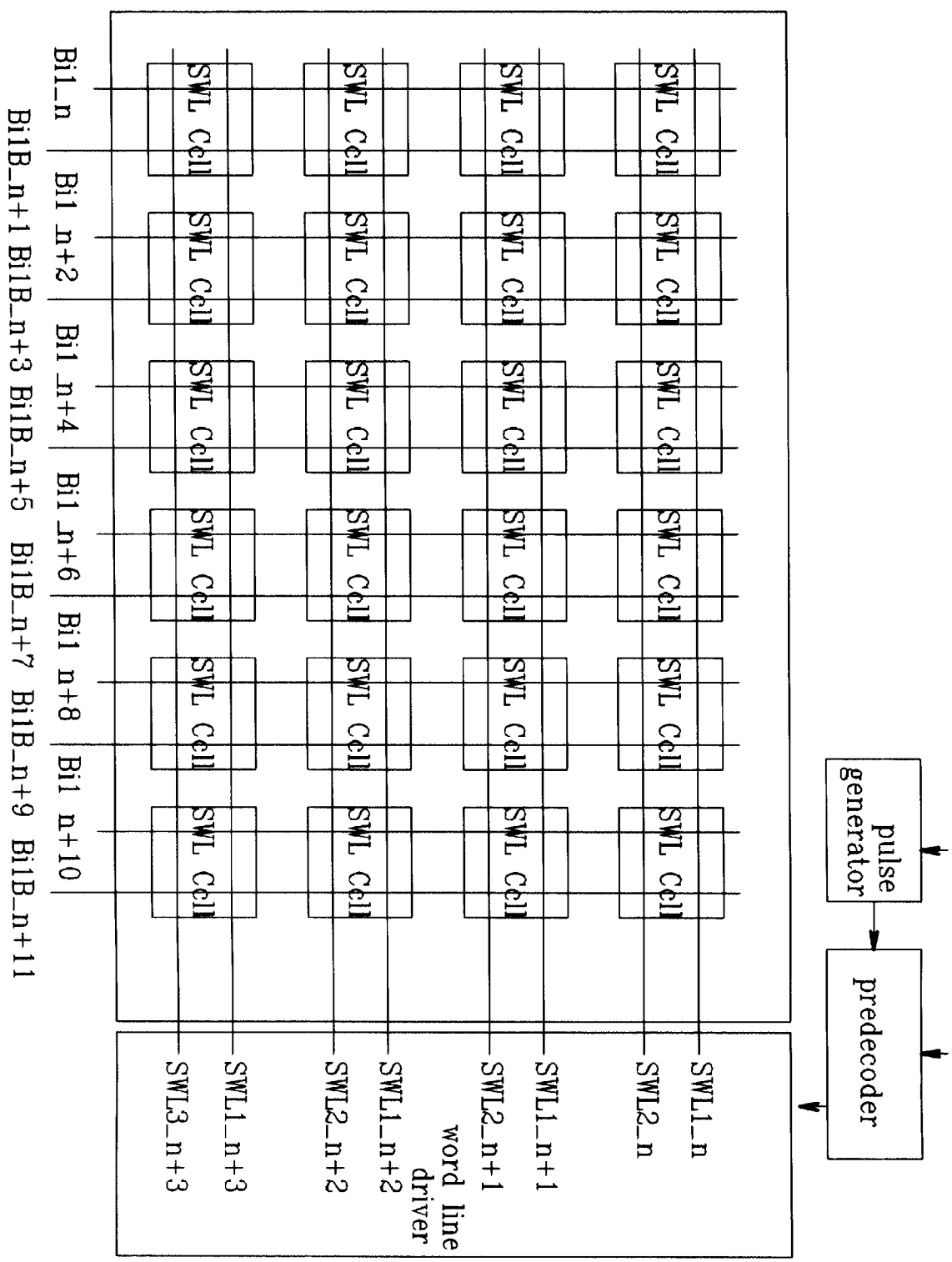

FIGS. 6a to 6c illustrate a circuit diagram of the ferroelectric memory according to a preferred embodiment of the present invention and cell array structures. FIGS. 7a and 7b and FIGS. 8a and 8b are timing waveforms showing the operation of write and read modes, respectively, of the ferroelectric memory according to a preferred embodiment of the present invention.

The memory cell according to a preferred embodiment of the present invention is implemented without forming separate cell plate line. As shown in FIG. 6a, the FRAM of 2T/2C includes a first transistor (T1) 70 of an NMOS type whose gate is connected with a first split word line (SWL1) 74, and a second transistor (T2) 72 of an NMOS type whose gate is connected with a second split word line (SWL2) 75. A first ferroelectric capacitor (C1) 71 has one electrode connected with the source of the first transistor 70 and the other electrode connected with the second split word line (SWL2) 75. A second ferroelectric capacitor (C2) 73 has one electrode connected with the first split word line 74 and the other electrode connected with the source of the second transistor 72. The drain of the first transistor 70 is connected with a bit line 76 and the drain of the second transistor 72 is connected with a /bit line 77. The bit line 76 and the /bit line 77 are connected with a column select controller and a sense amplifier for transferring data in read and/or write modes. The first and second split word lines 74 and 75 provide word line drive signals to drive the first and second transistors 70 and 72.

Figure 1:
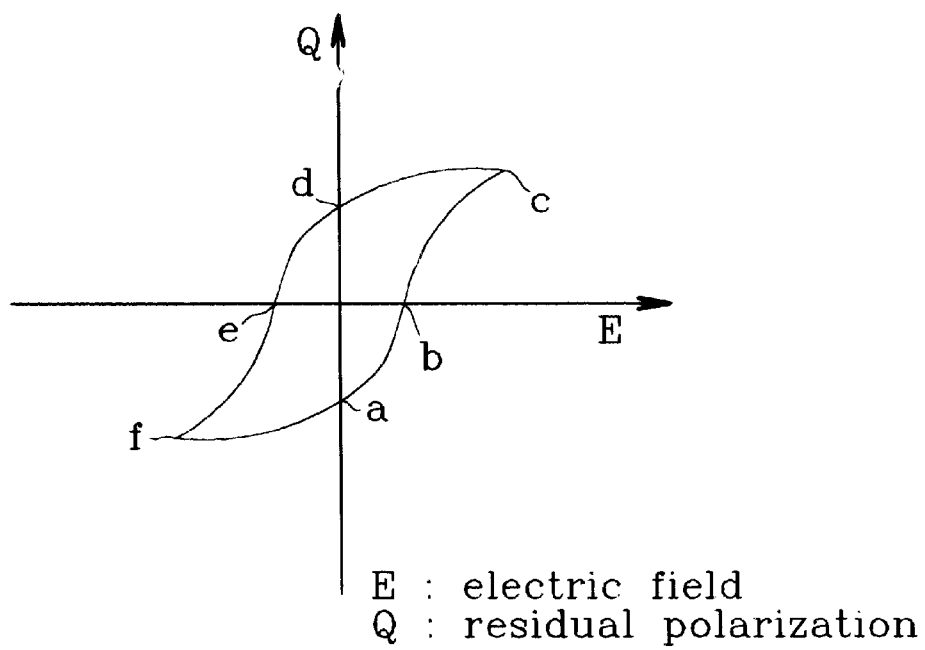
FIG. 1 is a characteristic curve showing a ferroelectric hysteresis loop.
Figure 2:
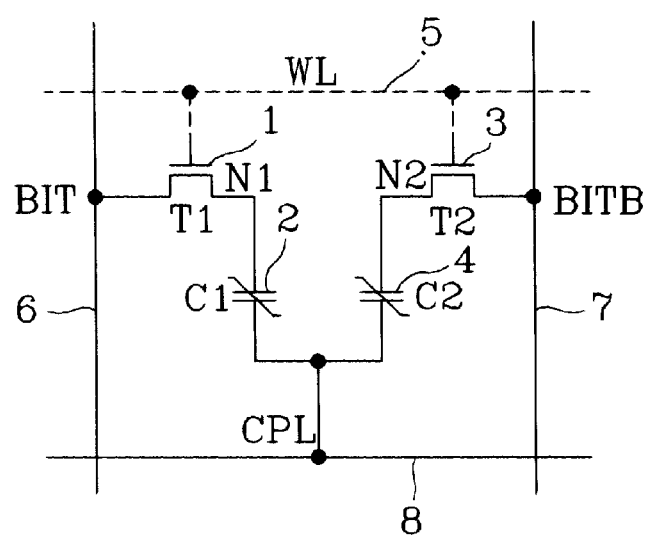
FIG. 2 is a circuit diagram of a background art ferroelectric memory.
Figure 3:
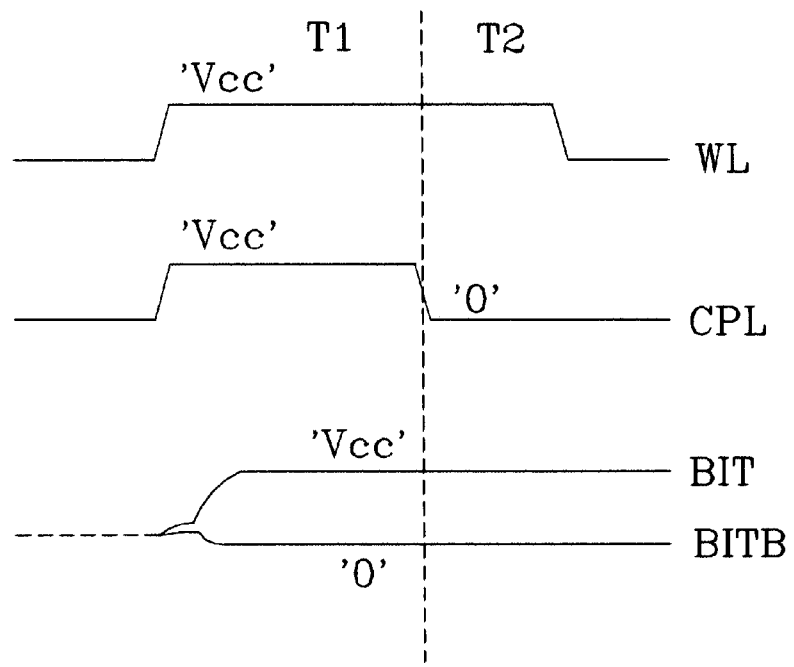
FIG. 3 shows a timing diagram for the operation of a background art ferroelectric memory.
Figure 4:
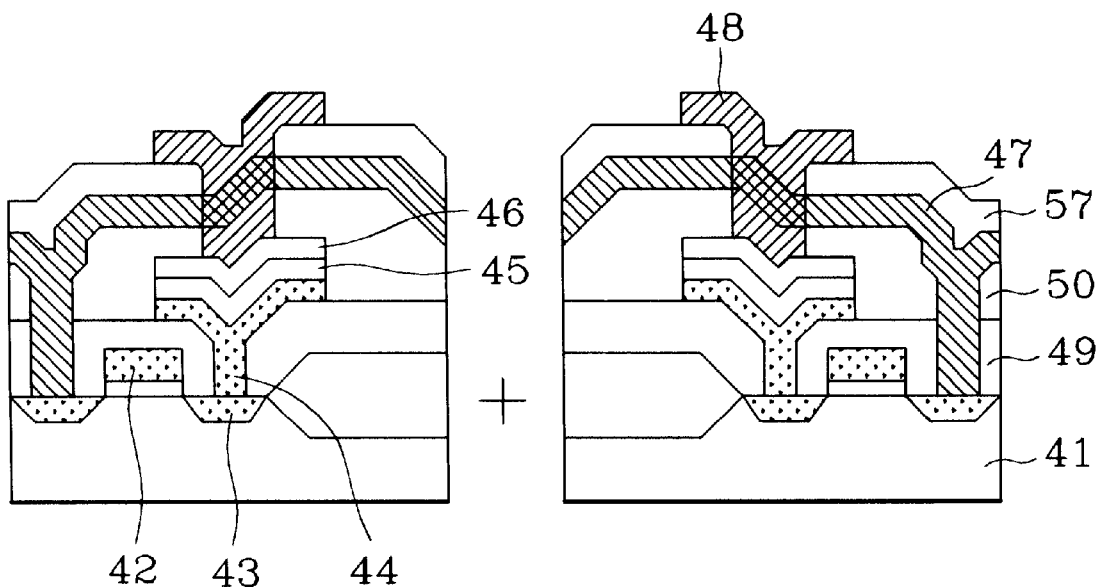
FIG. 4 is a cross sectional view showing the structure of a background art ferroelectric memory.
Figure 5A:
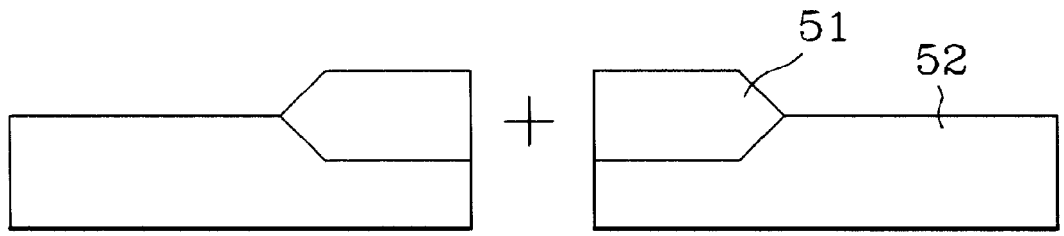
FIGS. 5a to 5i are a cross sectional view showing the manufacturing process of a background art ferroelectric memory.
Figure 5B:
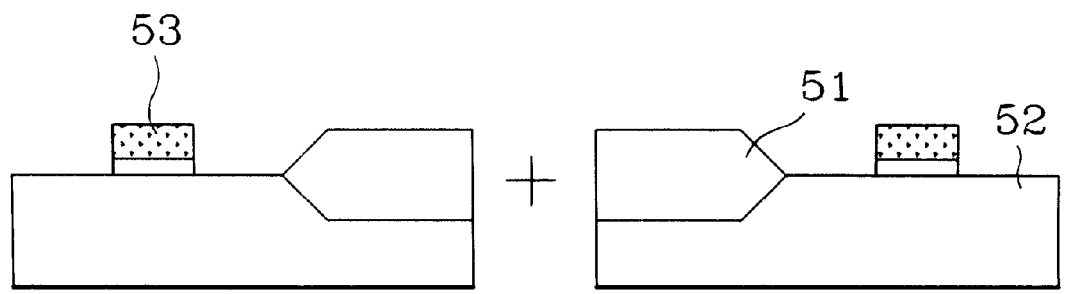
Figure 5C:
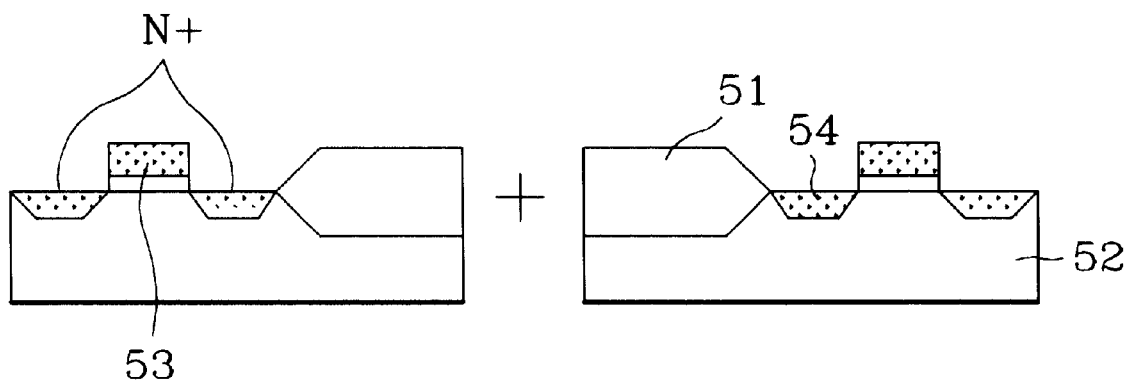
Figure 5D:
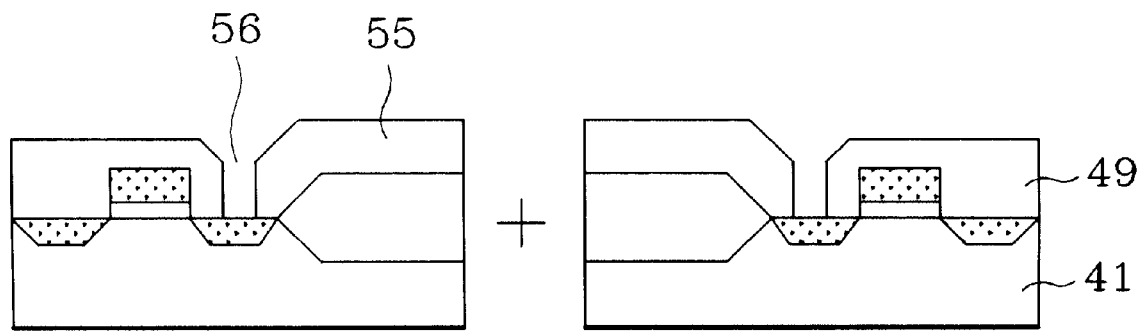
Figure 5E:
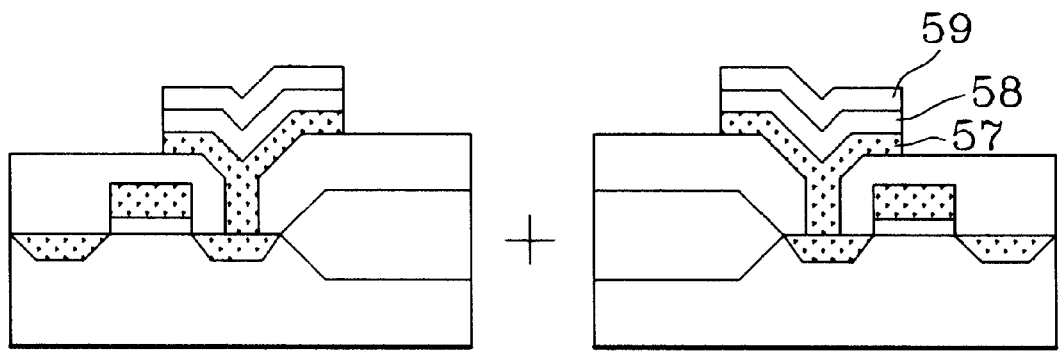
Figure 5F:
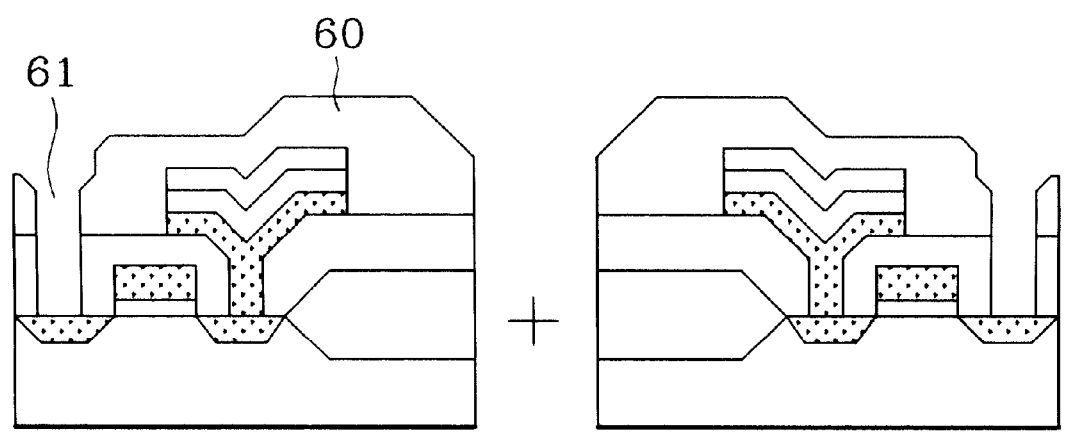
Figure 5G:
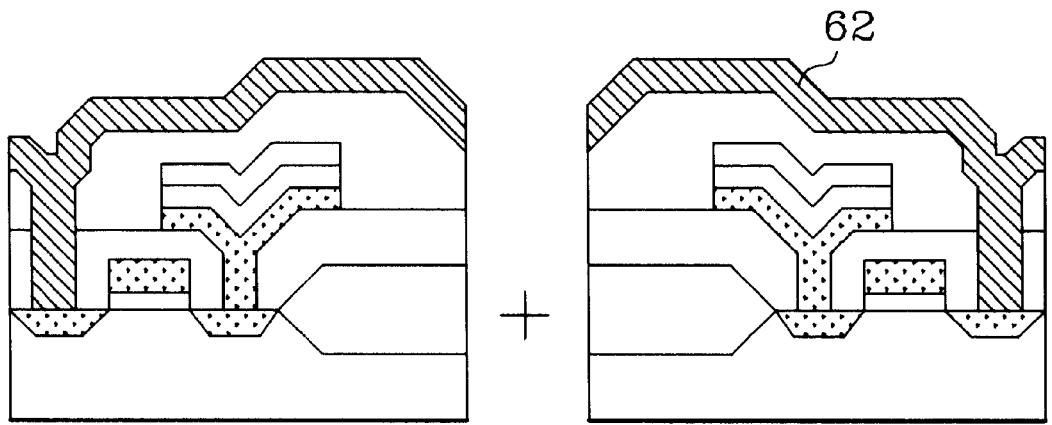
Figure 5H:
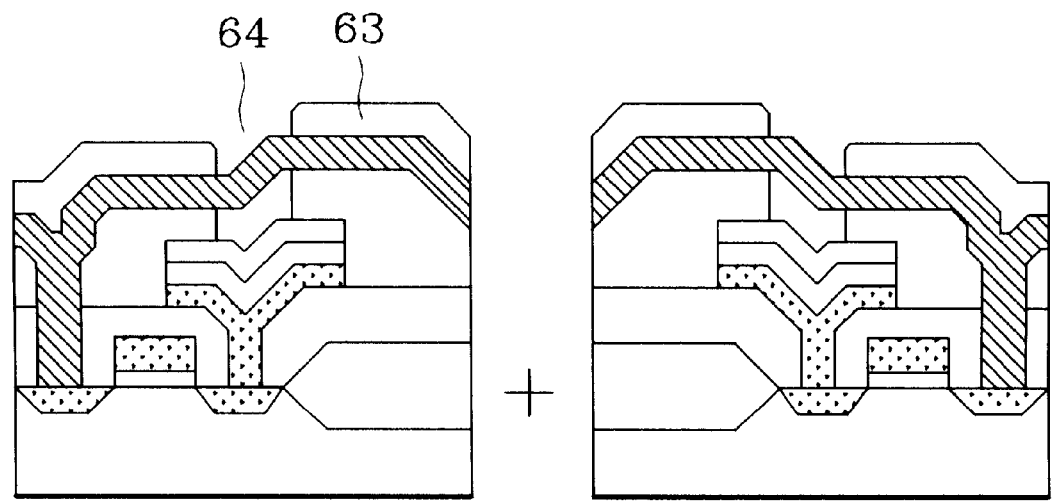
Figure 5I:
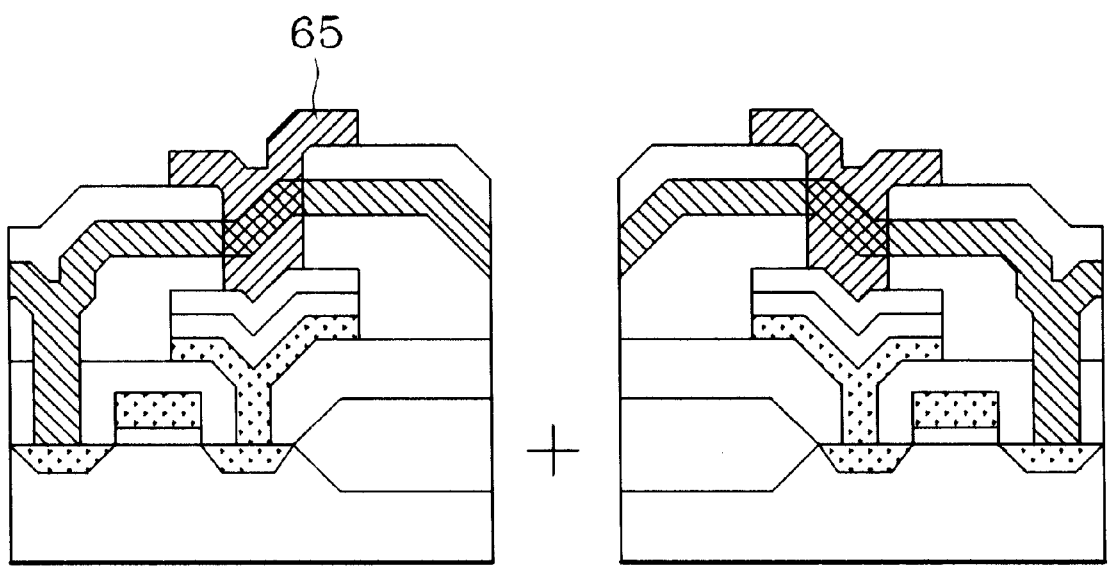

The operation of the SWL nonvolatile ferroelectric memory according to the preferred embodiment of the present invention is explained referring to the hysteresis loop of a ferroelectric in FIG. 1. The state that a high bias is applied from the first ferroelectric capacitor 71 to the source of the first transistor 70, i.e., node N1, and a low bias is applied to the second split word line 75 corresponds to the point c of the hysteresis loop in FIG. 1. When the same bias is applied to both electrodes of the first ferroelectric capacitor 71, the state of the first ferroelectric capacitor at this time corresponds to the point d. The c and d states in the first ferroelectric capacitor 71 are defined as the one state of the binary logic value.

On the contrary, the state that a low bias is applied from the first ferroelectric capacitor 71 to the node N1 and a high bias is applied to the second split word line 75 corresponds to the point f of the hysteresis loop in FIG. 1. If the same bias is applied to both electrodes of the first ferroelectric capacitor 71, and state of the first ferroelectric capacitor 71 at this time corresponds to the point a. The f and a states in the first ferroelectric capacitor 71 are defined as the zero state of the binary logic value.

In the same manner, the state that a high bias is applied from the second ferroelectric capacitor 73 to the source of the second transistor 72, i.e., node N2, and a low bias is applied to the first split word line 74 corresponds to the point c of the hysteresis loop in FIG. 1. If the same bias is applied to both electrodes of the second ferroelectric capacitor 73, the state of the node N2 at this time corresponds to the point d. The c and d states in the second ferroelectric capacitor 73 are defined as the one state of the binary logic value.

On the contrary, the state that a low bias is applied from the second ferroelectric capacitor 73 to the node N2 and a high bias is applied to the first split word line 74 corresponds to the point f of the hysteresis loop in FIG. 1. If the same bias is applied to both electrodes of the second ferroelectric capacitor 73, the state of the second ferroelectric capacitor at this time is corresponds to the point a. The f and a states in the second ferroelectric capacitor 73 are defined as the zero state of the binary logic value.

There are two methods in cell arrangement for the SWL nonvolatile ferroelectric memory cells according to the preferred embodiment of the present invention. A first method, as shown in FIG. 6b, is to construct an array structure so as to store one data per memory unit cell. In other words, the bit line and /bit line are amplified by one sense amplifier, and therefore, one data is outputted. A second method, as shown in FIG. 6c, is to construct an array structure so as to store two data per memory unit cell. In other words, each of the bit line and /bit line is amplified by one sense amplifier. In this case, each of the bit line and the /bit line output one data, and as a result, two data are stored per memory unit cell.

The read and write operations on the SWL nonvolatile ferroelectric memory according to the present invention is explained as follows.

Referring to FIGS. 7a–7b and 8a–8b, the timing for the data write and/or read operations of the SWL nonvolatile ferroelectric memory according to a preferred embodiment of the present invention is classified into 4 parts and different control pulses from each other are applied to the first and second split lines and the bit and/bit lines. The same timing can be applied to the read operation as well as the write operation, and therefore, a restore operation can be done at the same time as the read operation. In other words, while the SWL cell, which is selected in the write operation, operates in its write mode, the SWL cell, which is on the same word line operates, at the same time, is in its read mode, so that the restore operation is done in the nonselected SWL cell.

According to the timing control of the preferred embodiment, both the read mode and the write mode are easily executed at the same time. In the write mode of the time intervals t1, t2 and t3, the first and second ferroelectric capacitors 71 and 73 are polarized in the same polarization as the bit line 76 and the /bit line 77. In the read mode, the restore operation is done in the first and second ferroelectric capacitors 71 and 73 in the same polarization as the bit line 76 and the /bit line 77.

In other words, when the bit line 76 is at high level and the /bit line 77 is at low level, the write operation or the restore operation of one state polarization is done in the first ferroelectric capacitor 71 in the interval t3. The write operation or the restore operation of zero state polarization is done in the second ferroelectric capacitor 73 in the interval t1. When the bit line 76 is at low level and the /bit line 77 is at high level, the write operation or the restore operation of zero state polarization is done in the first ferroelectric capacitor 71 in the interval t1. The write operation or the restore operation of one state polarization is done in the second ferroelectric capacitor 73 in the interval t2.

When the restore operation in the write or read mode is done in the first ferroelectric capacitor 71, the pulses of the intervals t1, t2 and t3 are required. The interval t4 is a disable interval and is not necessarily required for the write mode or the read mode. (The interval t4 in FIGS. 7a and 7b and 8a and 8b is to show a control pulse waveform or a state of node of a disable state.) Even though the pulses in the interval t1, t2 and t3 are required, access time is not necessarily enlarged.

In the interval t1, the sensing amplifier is basically in operation and its output data is used for a restore operation or is applied to an output pad. At this time, the time intervals t2 and t3 are more required for the restore operation and it needs more time for the output data to be transmitted to the output pad. In other words, time is needed for the output data to be transmitted to an output buffer and for the data to be transmitted from the buffer to the output pad by receiving an output enable control signal. If the time for the buffer is made the same as the intervals t2 and t3, it is possible for a loss of an access time following the intervals t2 and t3 to be negligible.

Figure 7A:
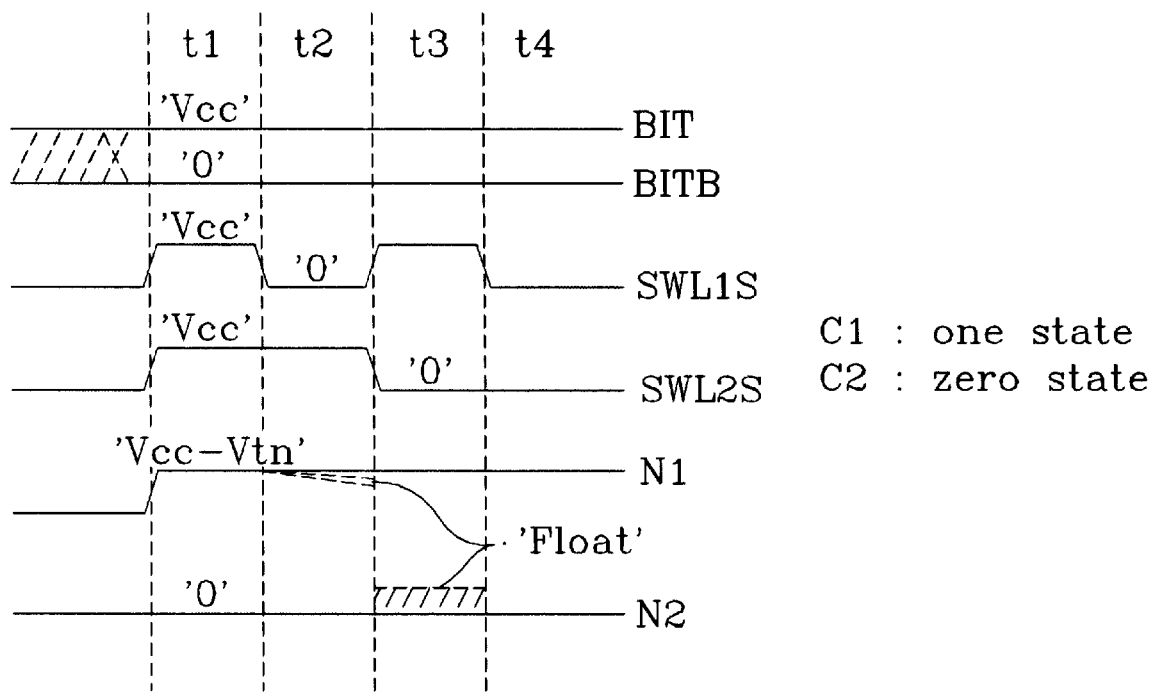
FIGS. 7a and 7b are timing diagrams showing an operation in a write mode of the ferroelectric memory according to the preferred embodiment of the present invention.
Figure 7B:
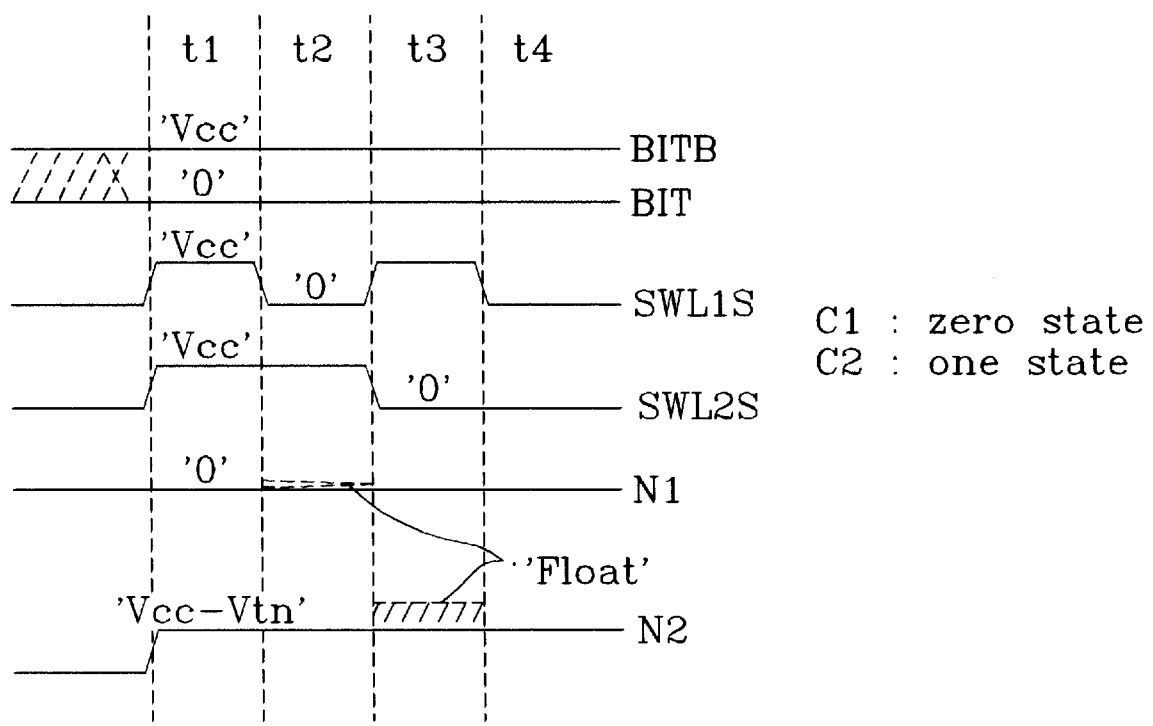
Figure 8A:
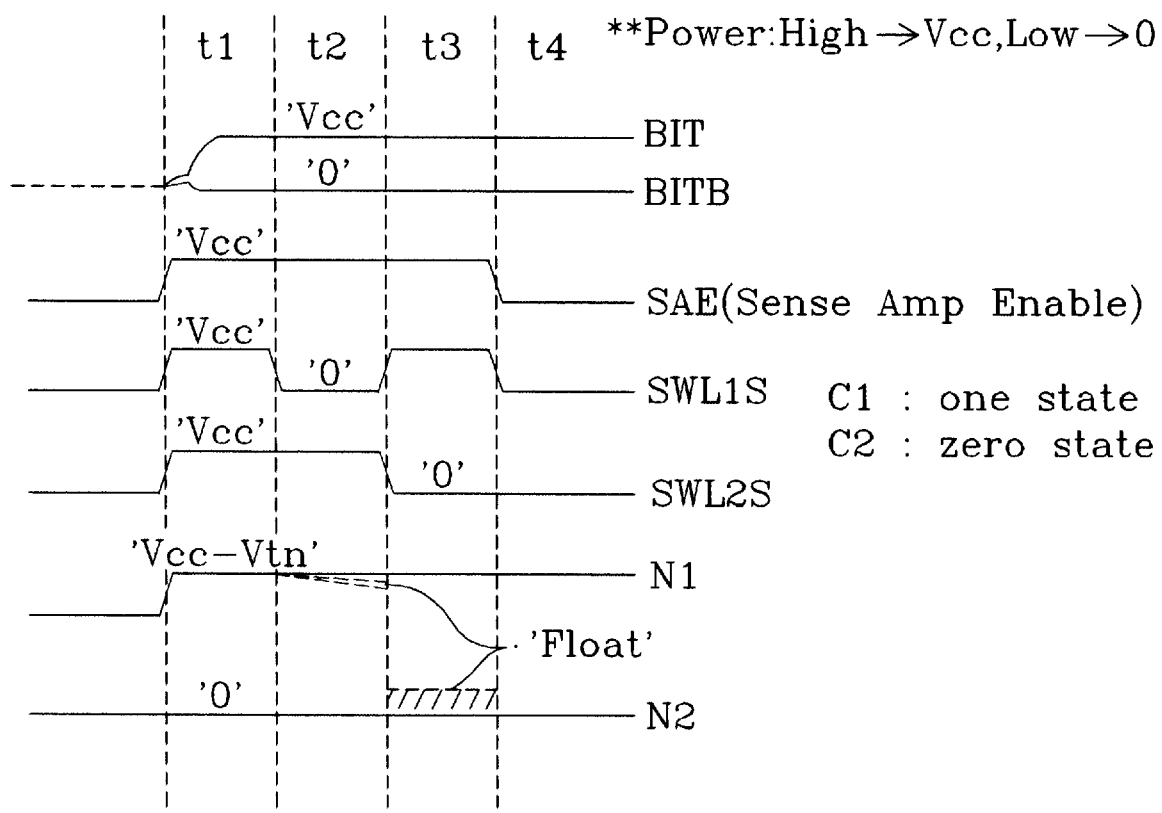
FIGS. 8a and 8b are timing diagrams showing an operation in a read mode of the ferroelectric memory according to the preferred embodiment of the present invention.
Figure 8B:
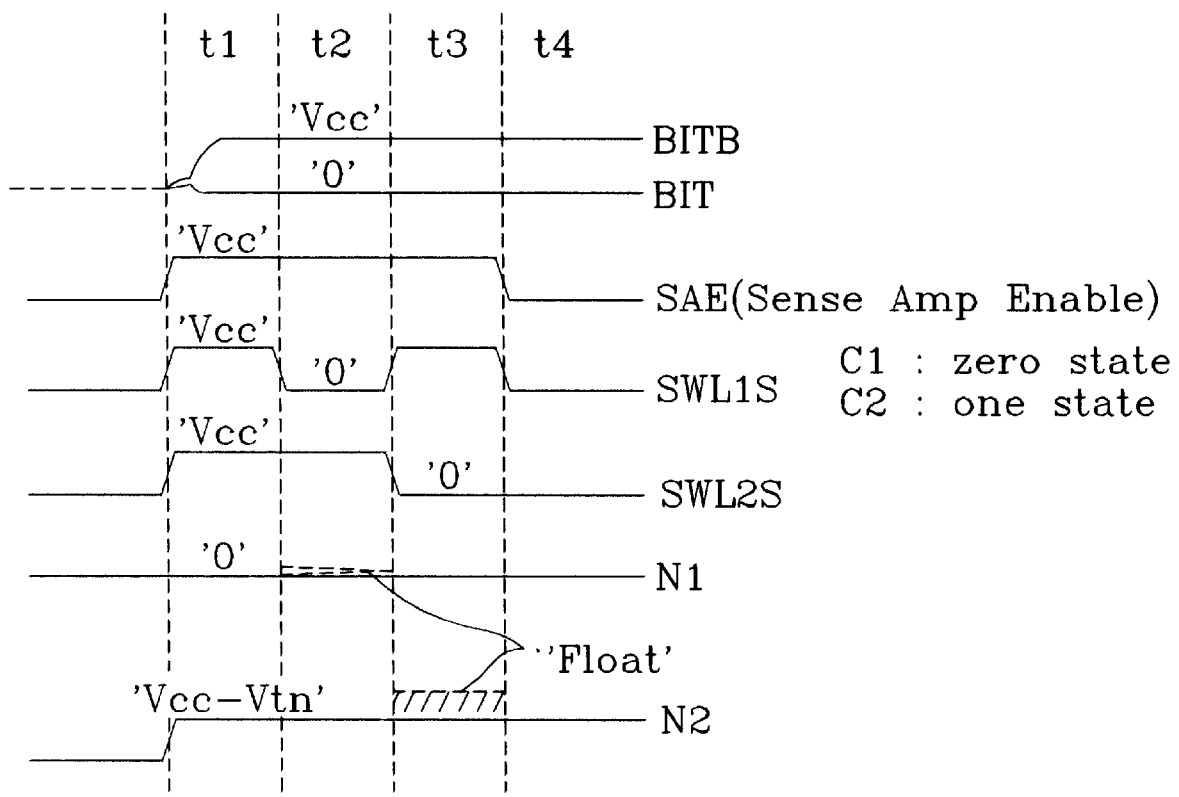

The explanation for the write and/or read modes according to each of the time intervals t1, t2, t3 and t4 is as follows with the first and second capacitors 71 and 72 to be polarized or is polarized at one and zero states, respectively, as illustrated in FIGS. 7a and 8a, and with the first and second capacitors 71, or with the first and second capacitors 71 and 72 to be polarized or is polarized at zero and one state, respectively, as illustrated in FIGS. 7b and 8b.

In the interval t1, the output signals SWL1S and SWL2S applied from a word line driver to the first and second split word lines 74 and 75 are shifted from a low level to a high level. When SWL1S and SWL2S are shifted from the low level to the high level, the first and second transistors 70 and 72 are turned on. The bit line 76 and the node N1 are electrically connected to each other, and the /bit line 77 and the node N2 are electrically connected to each other. At this time, the Vcc transmission characteristic, which is the high level of the first and second transistors 70 and 72, is Vcc-Vtn, and there is a threshold voltage drop loss Vtn of the NMOS transistor, but the low level is at the good value of 0V.

In the write mode of the time interval t1 of FIG. 7a, when the bit line 76 is high and the /bit line 77 is low, a voltage Vcc-Vtn is applied to the node N1 and a zero voltage is applied to the node N2. In this case, the first ferroelectric capacitor 71 is not polarized Because the voltage applied to the second ferroelectric capacitor 73 is high enough to cause the polarization, its state is positioned at the point f in the hysteresis loop of FIG. 1. Therefore, the second ferroelectric capacitor 73 is changed to the same polarization as the voltage of the /bit line 77.

When the /bit line 77 is at the high level and the bit line 76 is at the low level in the write mode of the time interval t1 of FIG. 7b, the voltage Vcc-Vtn is applied to the node N2 and a zero voltage is applied to the node N1. In this case, the second ferroelectric capacitor 73 is not polarized. Because the voltage applied to the first ferroelectric capacitor 71 is high enough to cause the polarization, its state is positioned at the point f in the hysteresis loop of FIG. 1. Therefore, the first ferroelectric capacitor 71 is changed to the same polarization as the voltage of the bit line 76.

Before the read mode goes to the interval t1, the bit line 76 and the /bit line 77 are equalized to a low level. The output signals SWL1S and SWL2S applied from a word line driver to the first and second split word lines 74 and 75 are shifted from a low level to a high level. When SWL1S and SWL2S are shifted from the low level to the high level, the first and second transistors 70 and 72 are turned on, and the charge of the node N1 and node N2 of the first and second ferroelectric capacitors 71 and 73 is transmitted to the bit line 76 and the /bit line 77.

If the first ferroelectric capacitor 71 has been at a one state and the second ferroelectric capacitor 73 has been at a zero state, the positive charge caused by the first ferroelectric capacitor 71 is more than that by the second ferroelectric capacitor 73 and the voltage of the bit line 76 is higher than that of the /bit line 77. The sensing amplifier amplifies the voltage difference between the two lines 76 and 77, and therefore, the bit line 76 goes up to a high and the /bit line 77 goes to a low. Therefore, the node N1 goes to Vcc-Vtn and the node 2 goes to 0V. See the time interval t1 of FIG. 8a Because the voltage difference between both electrodes of the first ferroelectric capacitor 71 is a voltage Vtn, the one state is not able to be restored. Because the voltage Vcc is applied to the second ferroelectric capacitor 73, the zero state is able to be restored therein.

On the contrary, if the first ferroelectic capacitor 71 has been at the zero state and the second ferroelectric capacitor 73 has been at the one state as illustrated in the time interval t1 of FIG. 8b, the positive charge caused by the first ferroelectric capacitor 71 is less than that by the second ferroelectric capacitor 73, and the voltage of the bit line 76 is lower than that of the /bit line 77. The sensing amplifier amplifies the voltage difference between the two lines 76 and 77, and therefore, the bit line goes up to a low level and the /bit line 77 goes to a high level. Therefore, the node N1 goes to 0V and the node N2 goes to Vcc-Vtn. As a result, because the voltage difference between both electrodes of the first ferroelectric capacitor 71 is Vcc the zero state is able to be restored. But Vtn is applied to the second ferroelectric capacitor 73 and therein the one state is not able to be restored. See time interval t1 of FIG. 8b.

According to the above details, it is possible to write and/or read in the time interval t1.

In the time interval t2, the output signal SWL1S of the word line driver is shifted from a high to a low and the signal SWL2S maintains its high level from the interval t1. If a pulse is changed like this, the first transistor 70 is turned off and the node N1 is in a floating state. The second transistor 72 keeps the turn on state, and the node N2 is electrically in connection with the /bit line 77.

The write mode and the read mode in the interval t2 is as follows with reference to FIG. 7a and FIG. 8a. In the interval from t1 to t2, when the bit line 76 is high and the /bit line 77 is low, the node N1 is in a floating state and therefore the state of the interval t1 is continuously maintained. There is no change in the voltage of SWL2S and therefore, there is no polarization change in the first ferroelectric capacitor 71. As the result, there is no movement on the hysteresis loop of FIG. 1. The state of the second ferroelectric capacitor 73 is moved from the point f to the point a on the hysteresis loop of FIG. 1.

And in the interval from t1 to t2 of FIGS. 7b and 8b, if the bit line 76 is low and the /bit line 77 is high, the node N1 is in a floating state, and therefore, the state of the interval t1 is almost maintained. Because there is no change in the voltage of SWL2S, there is no change in the polarization of the first ferroelectric capacitor 71. Therefore, there is no movement on the hysteresis loop of FIG. 1. The state of the second ferroelectric capacitor 73 moves to the point c on the hysteresis loop of FIG. 1. Accordingly, it is possible to write and/or restore the one state at the second ferroelectric capacitor 73 for the interval t2.

In the interval t3, the output signal SWL1S of the word line driver is shifted from low to high and SWL2S is shifted from high to low. The first transistor 70 is changed to the turn on state, and therefore, the node N1 is electrically connected with the bit line 76. The second transistor 72 is turned off and the node N2 is in the floating stare. When SWL1S is shifted from low to high, the node N2, which is supposed to be in a floating state, is able to be increased. The operation of the write and/or read modes in the interval t3 is as follows.

In the interval from t2 to t3, if the bit line 76 is high and the /bit line 77 is low, as illustrated in FIGS. 7a (write) and 8a (read), the voltage of the node N1 is Vcc-Vtn, which is transmitted from the state of the bit line 76. Because SWL2S is low, the first ferroelectric capacitor 71 moves to the point c on the hysteresis loop. The node N2 is in a floating state, and therefore, is affected by the increasing change of SWL1S but does not influence the polarization of the second ferroelectric capacitor 73. Therefore, the second ferroelectric capacitor 73 stays at the point a of the hysteresis loop.

In the interval from t2 to t3, if the bit line 76 is low and the /bit line 77 is high, as illustrated in FIGS. 7b and 8b, the node N1 is in a low level which is transmitted from the bit line 76 and SWL2S is low. Therefore, the first ferroelectric capacitor 71 moves to the point a on the hysteresis loop. The node N2 is in a floating stare and therefore is affected by the increasing change of SWL1S but does not have influence on the polarization of the second ferroelectric capacitor 73. Therefore, the second ferroelectric capacitor 73 returns to the point d of the hysteresis loop. Accordingly, it is possible to write and/or restore the one state at the first ferroelectric capacitor 71 for the interval t3.

In the interval t4, the output signal SWL1S of the word line driver is shifted from high to low and the output signal SWL2S is maintained at a low. Therefore, a selected SWL cell is disabled. Then, the first transistor 70 and the second transistor 72 are turned off and the node N1 and the node N2 are in the floating state. The node N1 and the node N2 gradually move to low by $n^+$ junction leakage. The operation of the write and/or read modes in the interval t4 is as follows.

In the interval from t3 to t4, if the bit line 76 is high and the /bit line 77 is low, as illustrated in FIGS. 7a and 8a, the polarization of the first ferroelectric capacitor 71 moves to the point d on the hysteresis loop and the polarization of the second ferroelectric capacitor 73 moves to the point a. If the bit line 76 is low and the /bit line 77 is high, as illustrated in FIGS. 7b and 8b, the polarization of the first ferroelectric capacitor 71 moves to the point a on the hysteresis loop and the polarization of the second ferroelectric capacitor 73 moves to the point d.

Figure 9:
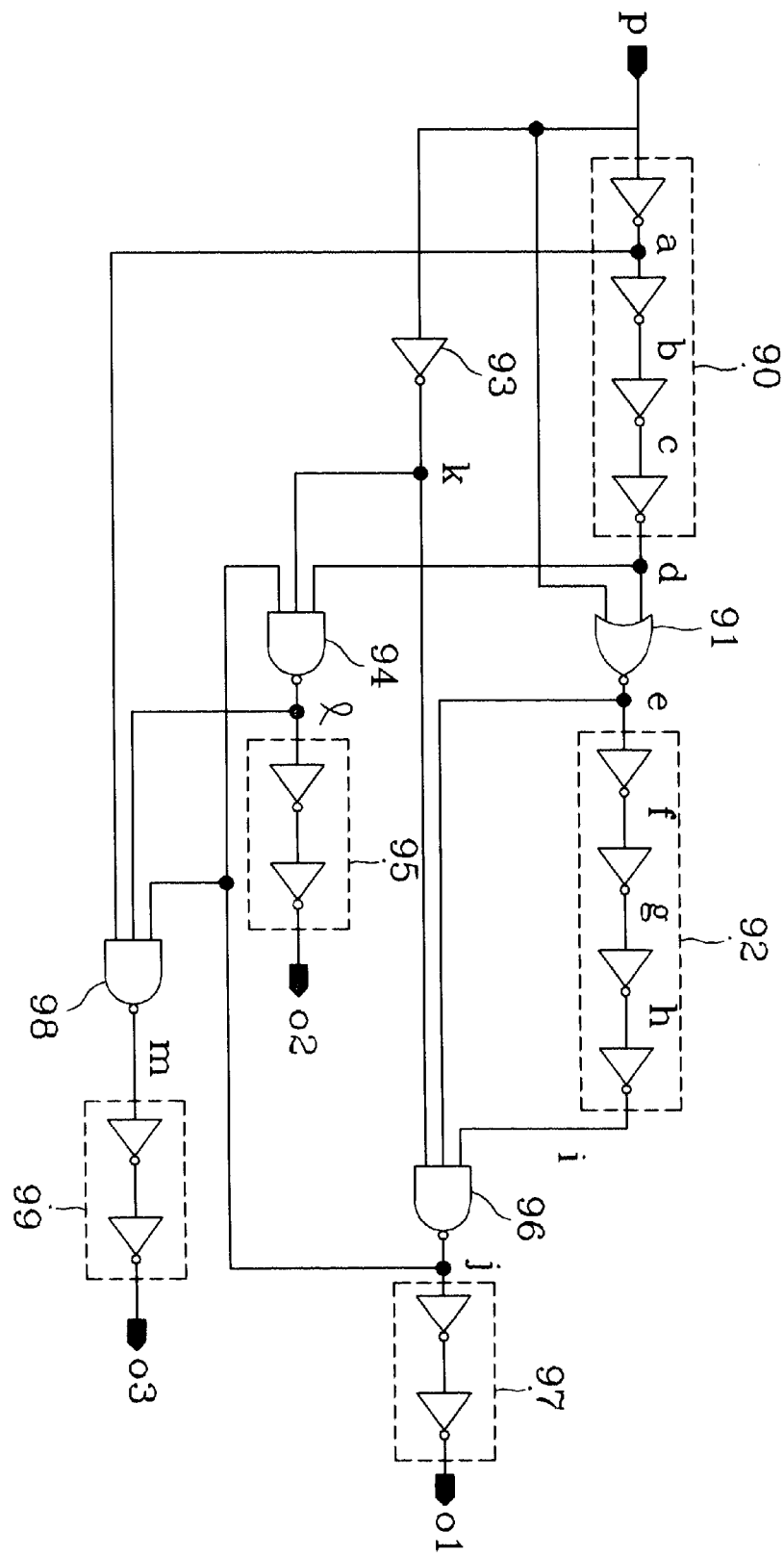
FIG. 9 is a circuit diagram of a word line drive control signal generator according to the preferred embodiment of the present invention.
Figure 10:
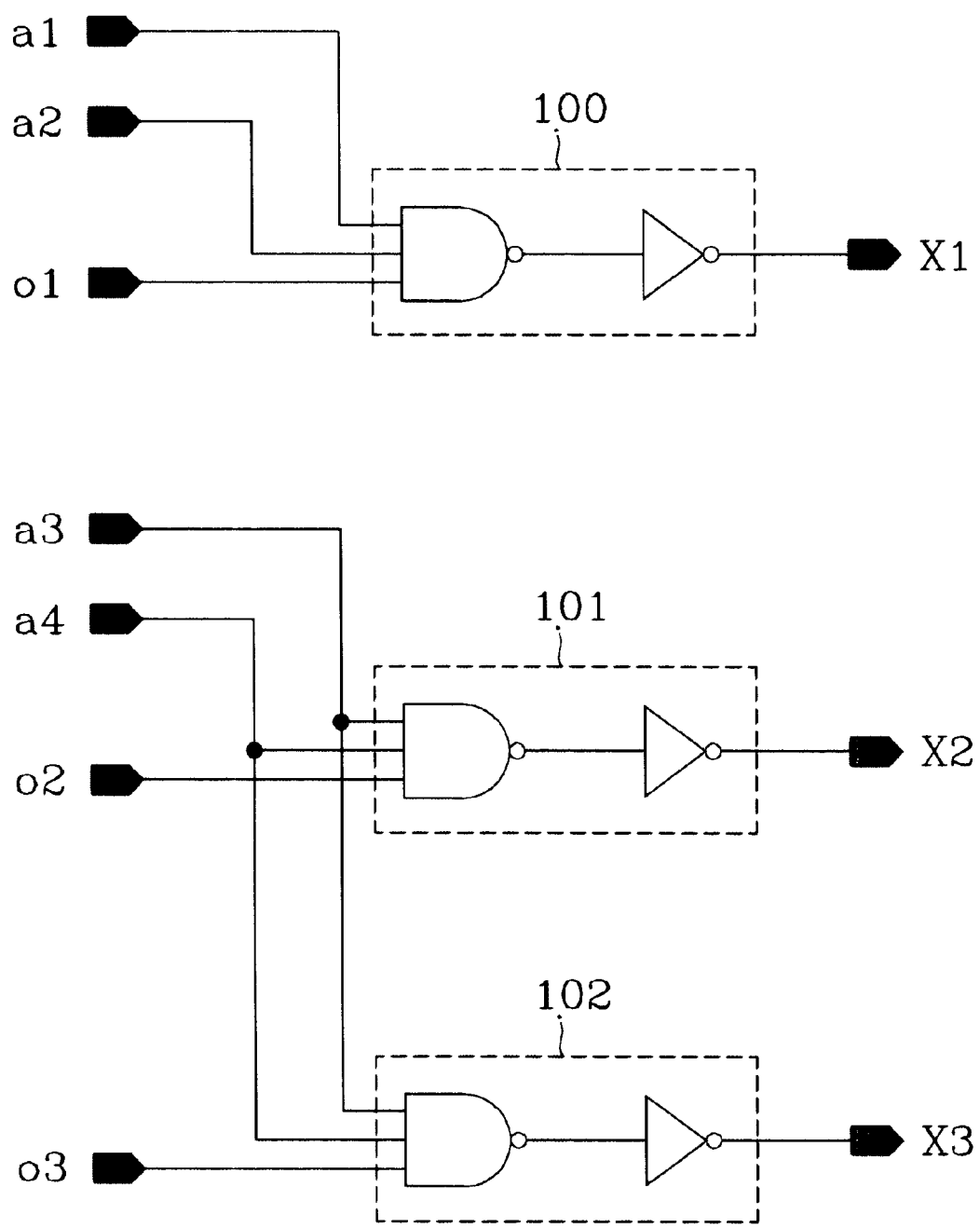
FIG. 10 is a circuit diagram of an address decoding signal generator according to the preferred embodiment of the present invention.
Figure 11:
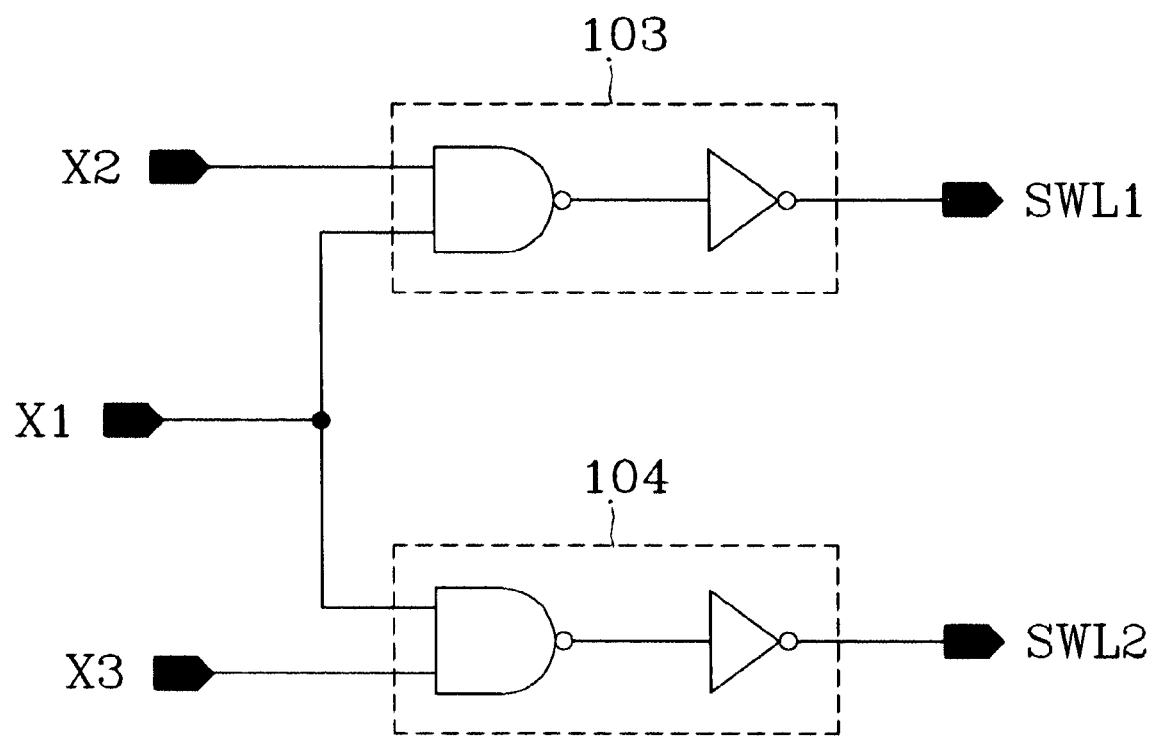
FIG. 11 is a circuit diagram of a word line drive signal generator of the ferroelectric memory according to the preferred embodiment of the present invention.

The structure of the word line driver for the read/write in the nonvolatile ferroelectric memory according to the preferred embodiment of the present invention is described hereinafter. FIG. 9 is a circuit diagram of a word line drive control signal generator according to the preferred embodiment of the present invention, and FIG. 10 is a circuit diagram of an address decoding signal generator according to the preferred embodiment of the present invention. FIG. 11 is a circuit diagram of the word line drive signal generator for the ferroelectric memory according to the preferred embodiment of the present invention.

The word line drive control signal generator of FIG. 9 is manufactured as a peripheral circuitry of a semiconductor device. A first pulse width controller 90 includes a plurality of inverters connected in series, in which at least one inverter has a different current ratio between PMOS and NMOS, to receive an address transition detection (ATD) input pulse and expands the pulse width for outputting an expanded pulse. A NOR output circuit 91 performs an NOR operation on the output signal of the first pulse width controller 90 and the ATD input pulse for outputting a signal.

A second pulse width controller 92 includes a plurality of inverters connected in series, in which at least one inverter has a different current ratio between PMOS and NMOS to receive the output signal of the NOR output circuit 91, and to expand the pulse width for outputting an expanded pulse. A first NAND output circuit 96 filters an inverted ATD pulse, the output signal of the NOR output circuit 91 and the output signal of said second pulse width controller 92, received through its three input terminal, respectively, and outputs a filtered signal. A first word line drive control signal generator 97 receives the filtered signal from the first NAND output circuit 96, buffers it and generates a first word line drive control signal o1.

A second NAND circuit 94 filters the output signal of the first pulse width controller 90, the output signal of the inverter 93 and the output signal of the first NAND output circuit 96, received through its three input terminals, respectively, by a NAND operation and outputs a filtered signal. A second word line drive control signal generator 95 buffers the output signal of the second NAND output circuit 94 to generate a second word line drive control signal o2.

A third NAND circuit 98 receives a signal, which has a controlled pulse width and is outputted from an inverter of first stage of the first pulse width controller 90 in which a current ratio between PMOS and NMOS is different from each other, the filtered signal of the second NAND output circuit 94 and the filtered signal of the first NAND output circuit 96 through its three input terminals, respectively. The third NAND output circuit 98 filters them by a NAND operation to output a filtered signal. A third word line drive control signal generator 99 buffers the output signal of the third NAND output circuit 98, to generate a third word line drive control signal o3.

Each of the first, second and third word line drive control signal generators 95, 97 and 99 is a buffer including two inverters in series connection, respectively. A width to length ratio of the PMOS of an inverter consisting of PMOS and NMOS, which have different current ratio from each other, is about 2:4, and a width to length ratio of the NMOS of the inverter is about 4:0.7. A width to length ratio of the gate of PMOS of the inverter, which does not control the width of input pulse but only inverts the input pulse, is about 12:0.8, and the width to length ratio of the NMOS of the inverter is about 6:0.7.

The circuit of the address decoding signal generator is shown in FIG. 10. This address decoding signal generator is formed in a peripheral circuit of the semiconductor device. The address decoding signal generator generates a first, second and third address decoding signals X1, X2 and X3 from the first, second and third word line drive control signals o1, o2 and o3 and first, second, third and fourth address buffer signals a1, a2, a3 and a4.

A first address decoding signal output circuit 100 executes a NAND operation on the first and second address buffer signals a1 and a2 and the first word line drive control signal o1 through its three input terminals, and generates the first address decoding signal X1 by inverting the output signal of the NAND operation. A second address decoding signal output circuit 101 executes a NAND operation on the third and fourth address buffer signals a3 and a4 and the second word line drive control signal o2 through its three input terminals and generates the second address decoding signal X2 by inverting the output signal of the NAND operation. A third address decoding signal output circuit 102 executes a NAND operation on the third and fourth address buffer signals a3 and a4 and the third word line drive control signal o3 through its three input terminals and generates the third address decoding signal X3 by inverting the output signal of the NAND operation. Each of the first, second and third address decoding signal output circuits 100, 101 and 102 is preferably provided with a NAND gate and an inverter in connection with the output terminal of the NAND gate.

The word line drive control signal generator of FIG. 11 is to generate the drive signals SWL1S and SWL2S, which are applied to the first and second split word line 74 and 75, respectively. A first word line drive control signal generator 103 executes a NAND operation on the first and second address decoding signals X1 and X2 and generates the first drive signal SWL1S to be applied to the first split word line 64 by inverting the output signal of the NAND operation. A second word line drive signal generator 104 executes a NAND operation on the first and third address decoding signals X1 and X3 and generates the second drive signal SWL2S to be applied to the second split word line 75 by inverting the output signal of the NAND operation. Each of the first and second word line drive signal generators 103 and 104 is provided with a NAND gate and an inverter in connection with the output terminal of the NAND gate.

Figure 12:
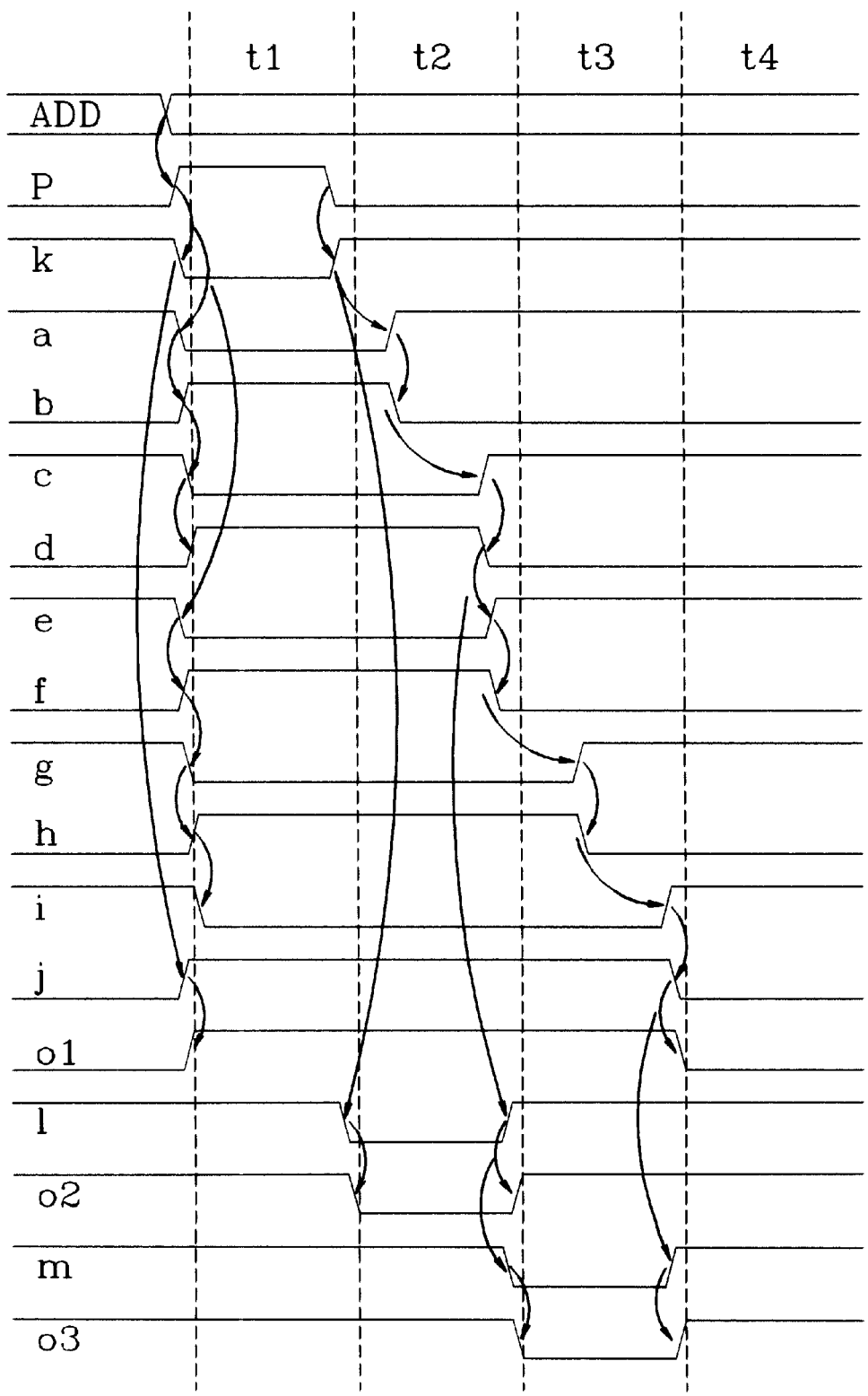
FIG. 12 is an operation timing diagram of a word line drive control signal generator according to the preferred embodiment of the present invention.
Figure 13:
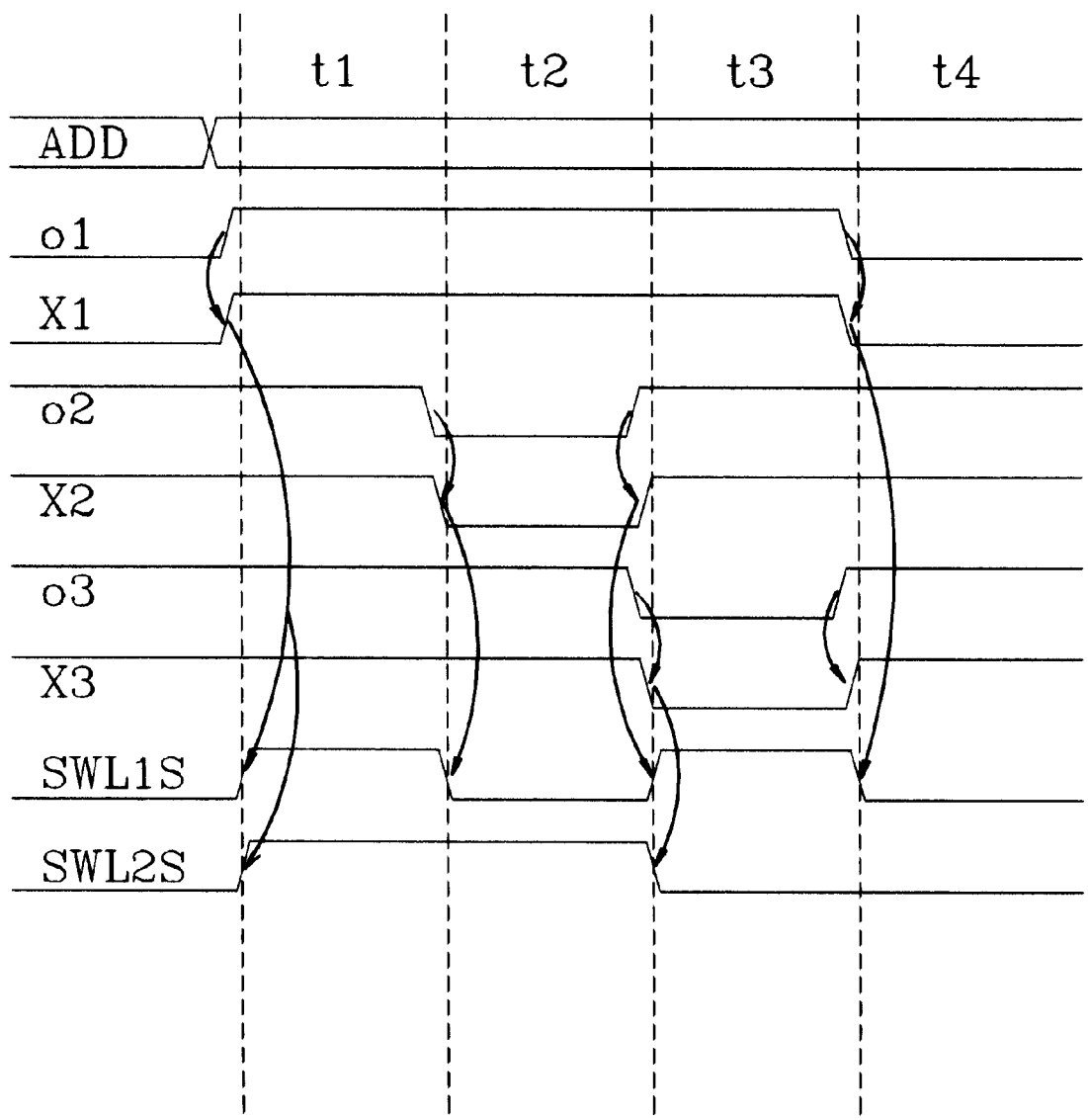
FIG. 13 is an operation timing diagram of a word line drive signal generator according to the preferred embodiment of the present invention.

The operation for generating the decode and drive signals in the SWL nonvolatile ferroelectric memory according to the preferred embodiment of the present invention is explained as follows, by referring to FIGS. 12 and 13. If the ATD input pulse is applied to an input stage of the word line drive control signal generator of FIG. 9, the first pulse width controller 90 adjusts the width of the ATD input pulse and the NOR gate 91 executes the NOR operation on the output of the controller 90 and the ATD input signal received through its two input terminal. The output signal of the NOR gate 91 is applied to the second pulse width controller 92 so that the pulse width is expanded.

The first NAND output circuit 96 executes the NAND operation on the output signal of the NOR gate 91, the output signal of the inverter 93 inverting the ATD input signal and the output signal of the second pulse width controller 92 which are received through the three input terminals and supplies the buffer 97 with its output signal. The first word line drive control signal o1 is obtained from the output terminal of the buffer 97.

In a similar way, the second NAND output circuit 94 executes the NAND operation on the output signal of the first pulse width controller 90, the output signal of the inverter 93 inverting the ATD input signal and the output signal of the first NAND output circuit 96, which are received through the three input terminals, and supplies the buffer 95 with its output signal. The second word line drive control signal o2 is obtained from the output terminal of the buffer 95. The third NAND output circuit 98 executes the NAND operation on the output signals of the first and second NAND output circuits 94 and 96 and a signal inverted from the ATD input signal which are received through the three input terminals and supplies the buffer 99 with its output signal. The third word line drive control signal o3 is obtained from the output terminal of the buffer 99.

The first, second and third word line drive control signals o1, o2 and o3 are applied to the address decoding signal generator of FIG. 10, which generates the first, second and third address decoding signals. In other words, the first word line drive control signal o1 and the first and second address buffer signal a1 and a2 are applied to the first address decoding signal generator 100 in which a NAND operation and an inversion are executed in sequence, and therefrom the first address decoding signal X1 is obtained.

The second word line drive control signal o2 and the third and fourth address buffer signal a3 and a4 are applied to the second address decoding signal generator 101 in which a NAND operation and an inversion are executed in sequence, and therefrom the second address decoding signal X2 is obtained. The third word line drive control signal o3 and the third and fourth address buffer signal a3 and a4 are applied to the third address decoding signal generator 102, in which a NAND operation and an inversion are executed in sequence, and therefrom, the third address decoding signal X3 is obtained. The first, second and third address decoding signals X1, X2 and X3 are applied to the word line drive signal generators of FIG. 11 in which a NAND operation and an inversion are executed in sequence, and therefrom, two signals to drive the first and second split word lines are obtained.

Figure 14:
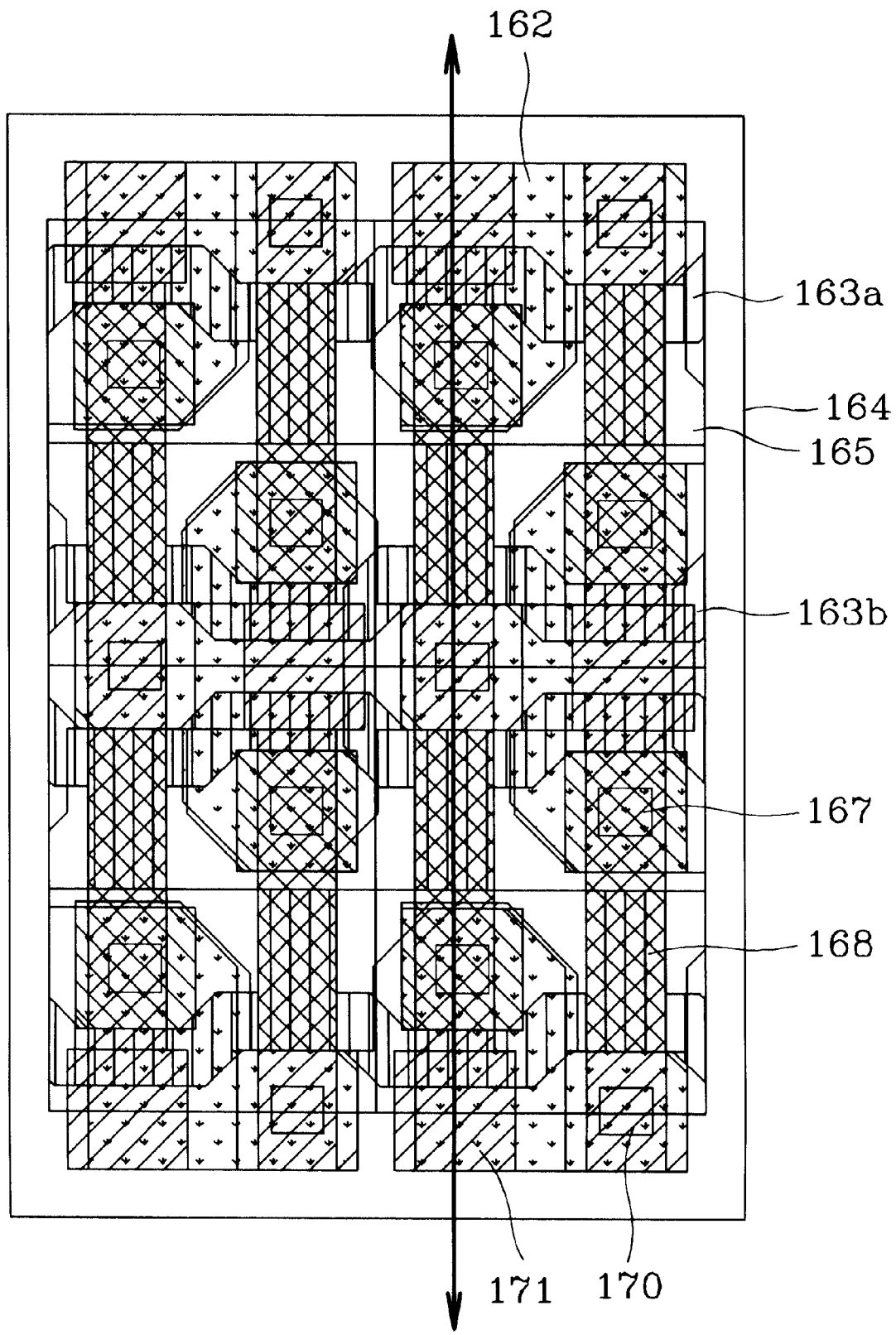
FIG. 14 is a layout diagram of the ferroelectric memory according to the preferred embodiment of the present invention.
Figure 15:
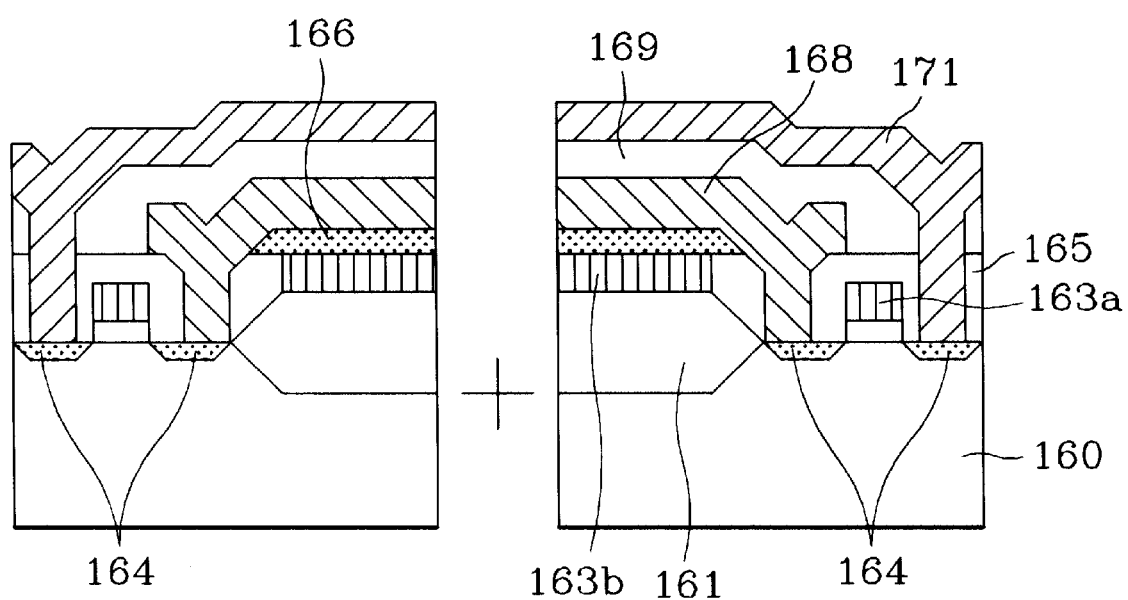
FIG. 15 is a cross sectional view of a structure of the ferroelectric memory according to the preferred embodiment of the present invention.

FIG. 14 is a layout of the ferroelectric memory according to the present invention, and FIG. 15 is a cross sectional view of the ferroelectric memory according to the present invention. FIGS. 16a to 16h are cross sectional views for the manufacturing process of the ferroelectric memory according to the present invention.

As shown in FIGS. 14 and 15, the nonvolatile ferroelectric memory includes semiconductor substrate 160 having an active region defined by a field oxide layer 161. A gate line 163a is selectively formed in the active region of the semiconductor substrate 160, and therefrom is used as first and second split word lines, and a lower electrode 163b of a capacitor. A source/drain region 164 is formed on the surface on both sides of the gate lines 163a in the semiconductor substrate 160. A first insulation layer 165 is selectively formed on the gate line 163a and the source/drain region 164. A ferroelectric layer 166 is formed on the lower electrode 163b of the capacitor. A metal electrode layer (upper electrode of capacitor+contact plug layer) 168 is formed on the upper side of the ferroelectric layer 166, and therefrom is in contact with one of the source/drain region 164. A second insulation layer 169 is selectively formed on the metal electrode layer 168. A metal line layer (bit line and /bit line) 171 is in contact with the other source/drain region 164.

Figure 16A:
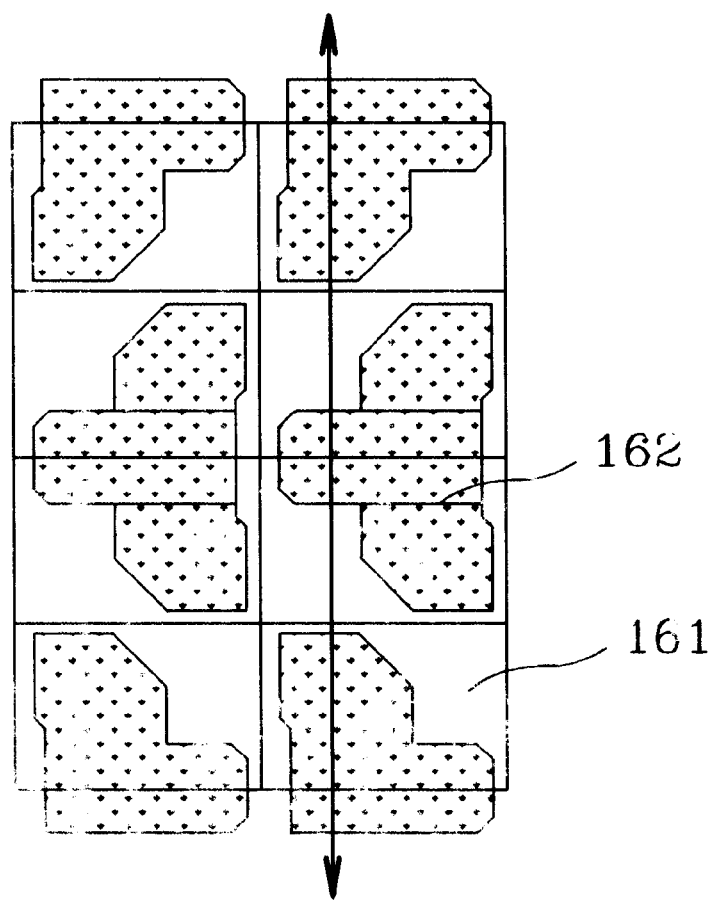
FIGS. 16a to 16h are cross sectional views of a manufacturing process of the ferroelectric memory according to the preferred embodiment of the present invention.
Figure 16A:
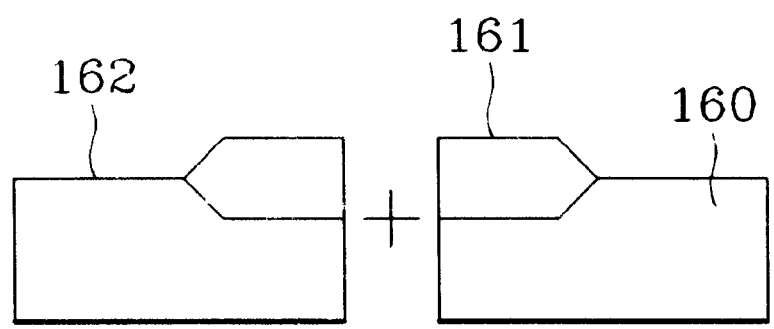
Figure 16B:
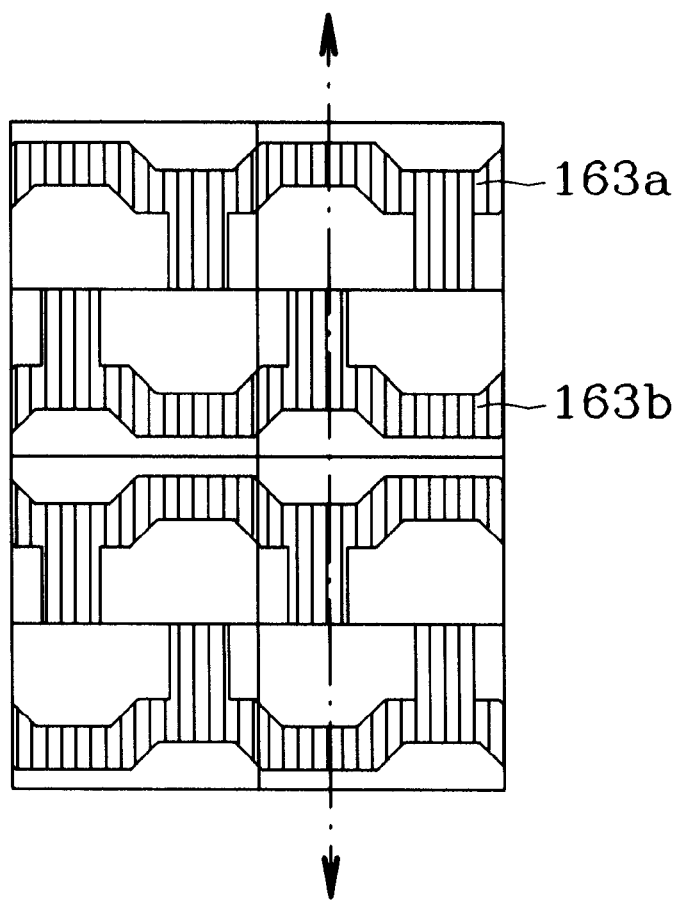
Figure 16B:
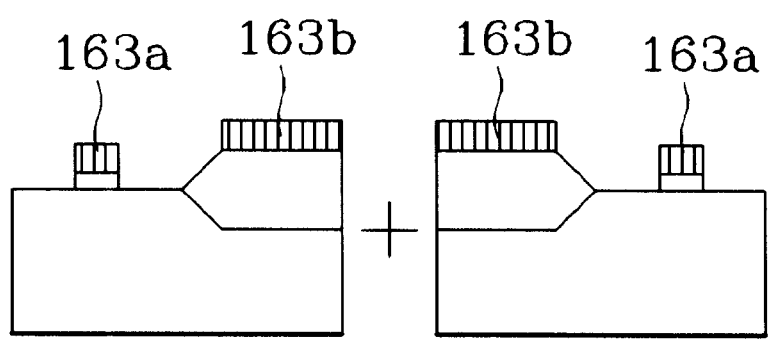
Figure 16C:
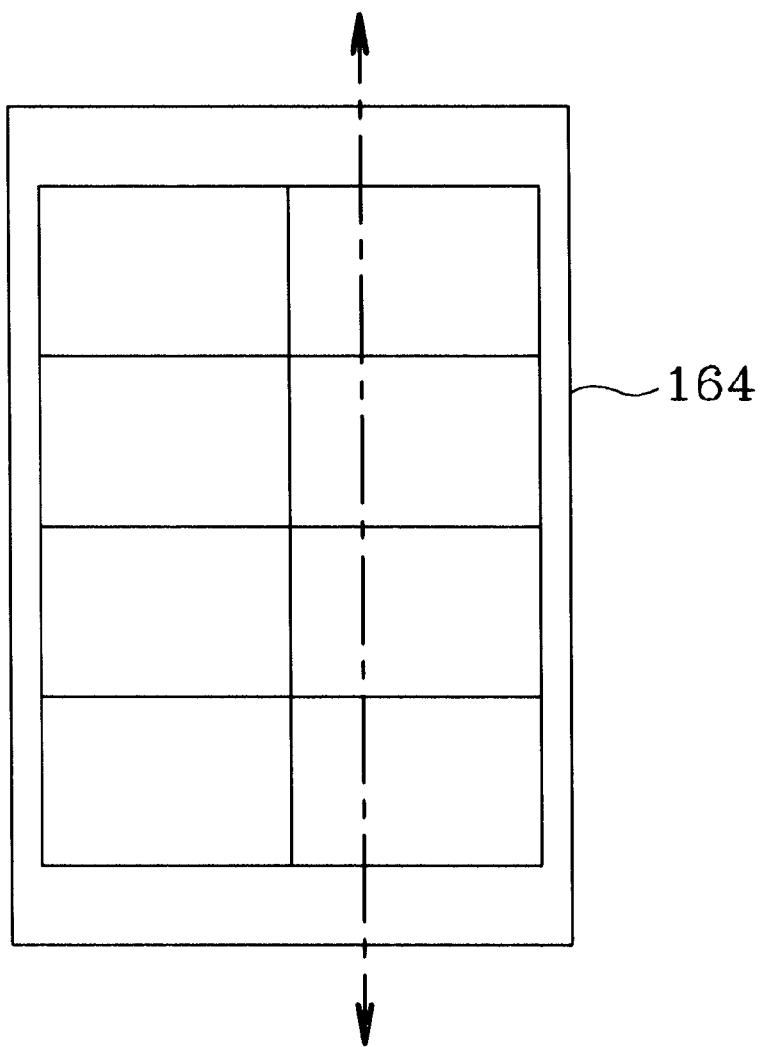
Figure 16C:
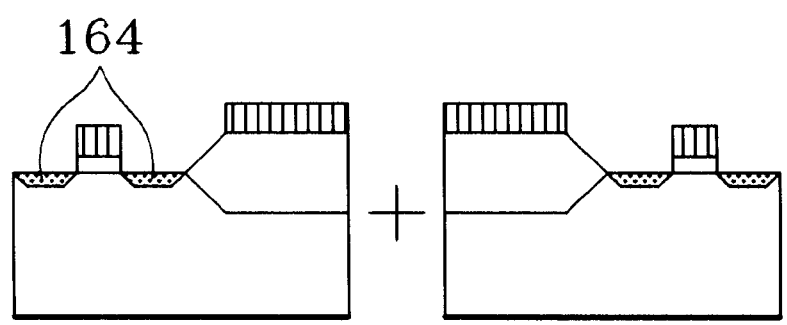
Figure 16D:
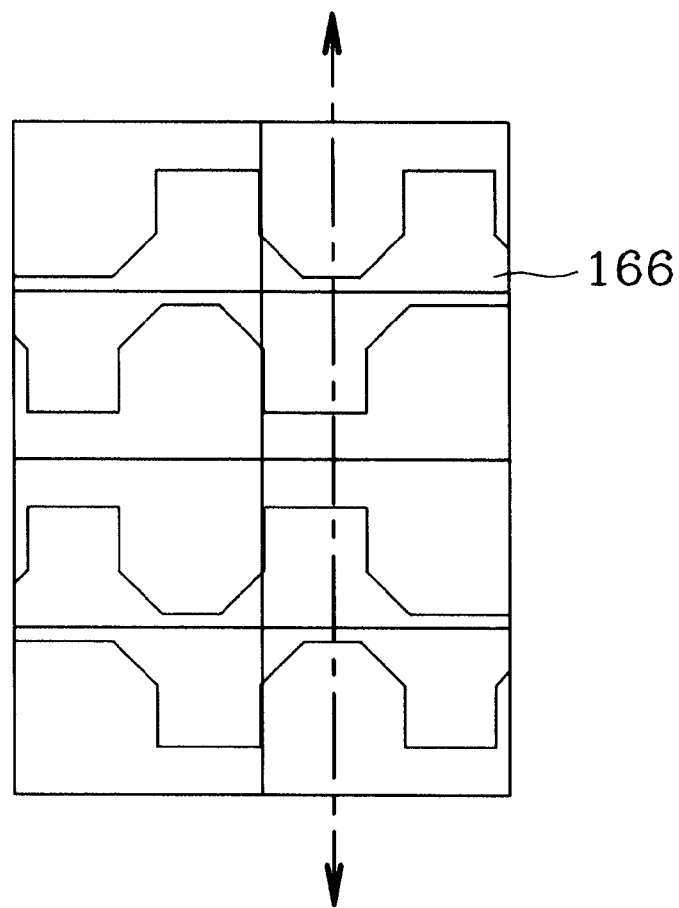
Figure 16D:
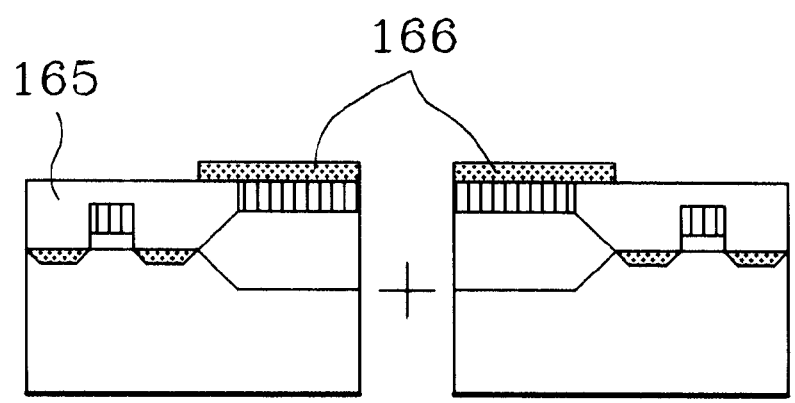
Figure 16E:
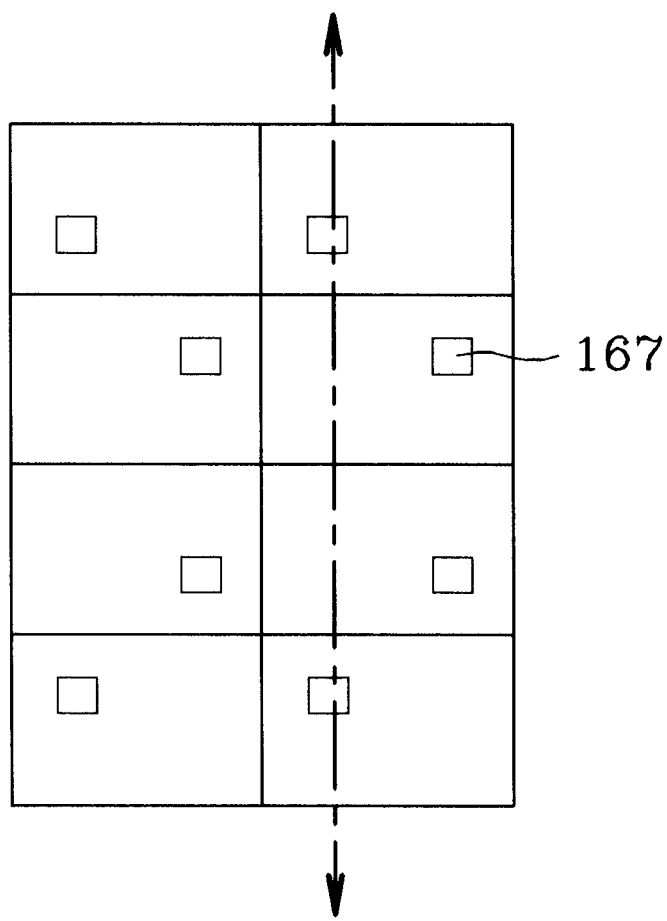
Figure 16E:
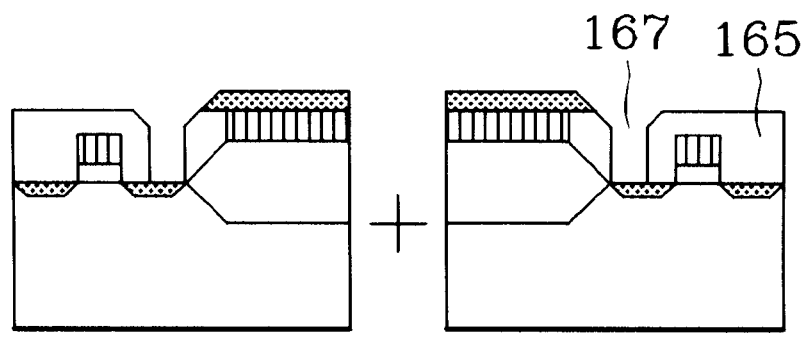
Figure 16F:
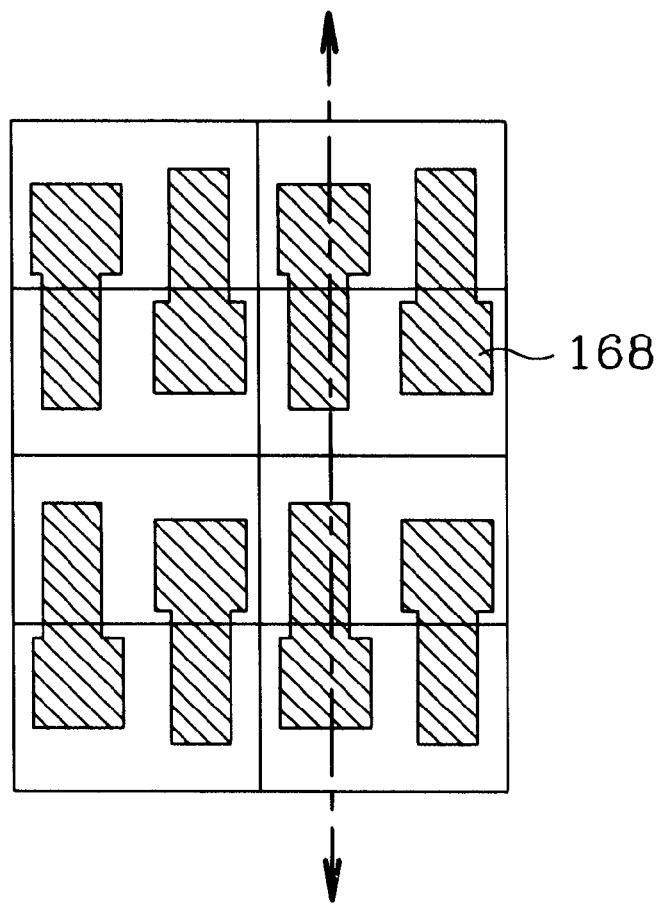
Figure 16F:
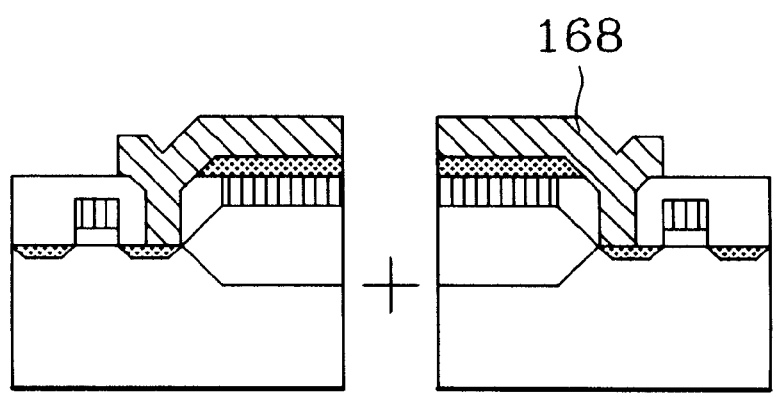
Figure 16G:
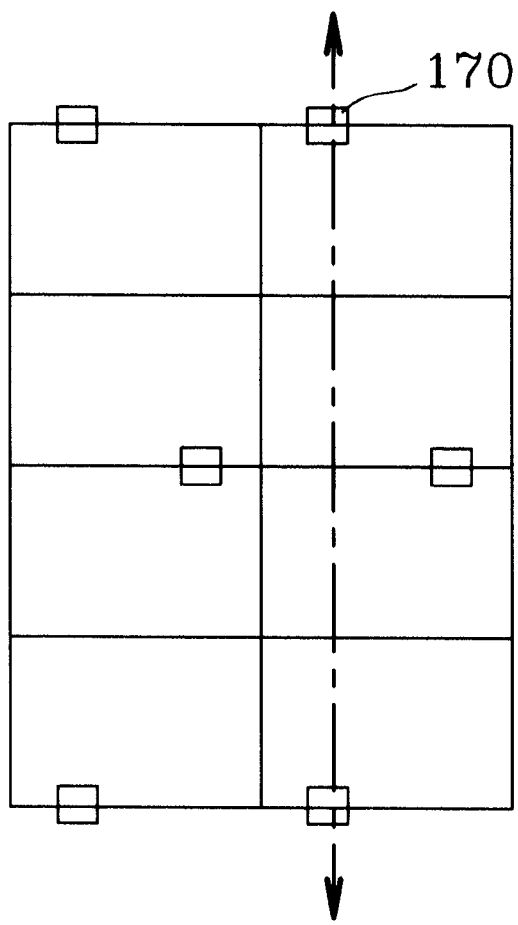
Figure 16G:
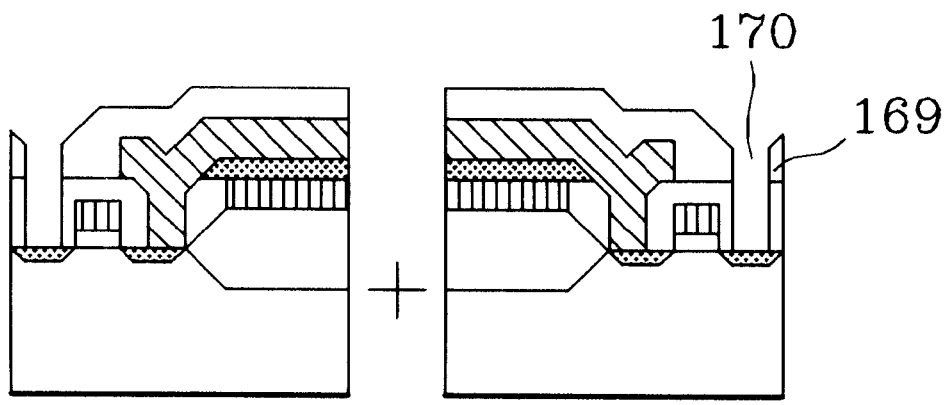
Figure 16H:
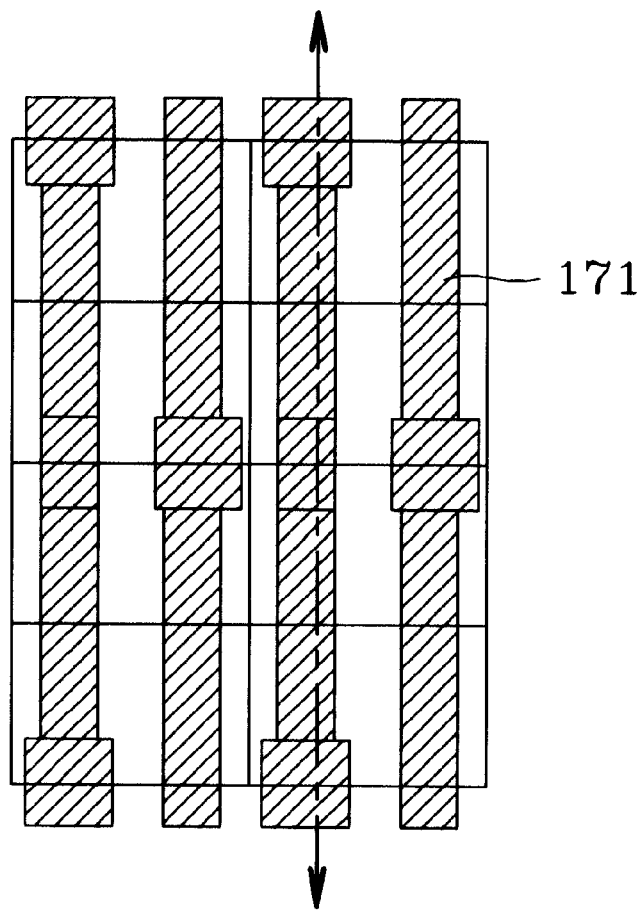
Figure 16H:
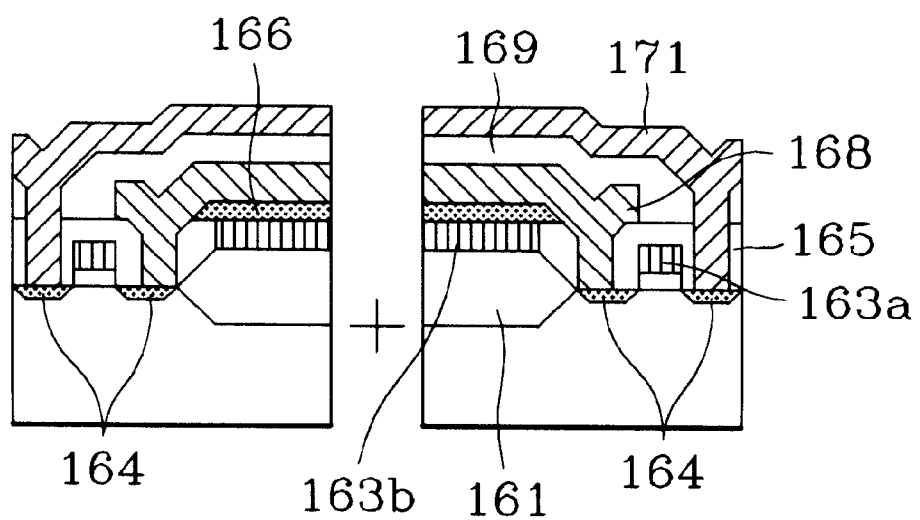

The manufacturing process for the nonvolatile ferroelectric memory in accordance with the preferred embodiment of the present invention is explained as follows. First, as shown in FIG. 16a, a field oxide layer 161 is formed in the element insolation region of the semiconductor substrate 160, and active region 162, in which a first and second transistors 70 and 72 are formed, is defined. In the next process, as shown in FIG. 16b, a gate line 163a of the first and second transistors 70 and 72 and a lower electrode 163b, on which the first and second ferroelectric capacitors 71 and 73 are formed, are formed. As shown in FIG. 16c, the source/drain region 164 of the first and second transistors 70 and 72 is formed by an impurity ion injection process using the gate line 163a and the lower electrode 163b as a mask.

What is claimed is:

1. A ferroelectric memory comprising:

a plurality of unit cells, wherein each unit cell comprises:
a first transistor having a source, a drain and a gate, the gate being connected with a first word line;
a first ferroelectric capacitor with an electrode connected to the source of said first transistor and another electrode connected with a second word line;
a second transistor having a source, a drain and a gate, the gate being connected with the second word line; and
a second ferroelectric capacitor with an electrode connected with the source of said second transistor and another electrode connected with the first word line.

2. The ferroelectric memory of claim 1, wherein the drain of first and second transistors is connected with a first bit line and a second bit line, respectively.

3. A ferroelectric memory comprising:

first split word lines and second split word lines;

first transistors, each first transistor having a source, a drain and a gate and each gate being in a one-to-one connection with a corresponding first split word line;

second transistors, each second transistor having a source, a drain and a gate and each gate being in a one-to-one connection with a corresponding second split word line;

a plurality of first ferroelectric capacitors, each first ferroelectric capacitor having an electrode connected with a source of a corresponding first transistor and another electrode connected with a corresponding second split word line;

a plurality of second ferroelectric capacitors, each second ferroelectric capacitor having an electrode connected with a corresponding first split word line and another electrode connected with a source of a corresponding second transistor;

a plurality of first bit lines, each first bit line being connected with a drain of the corresponding first transistor; and a plurality of second bit lines, each second bit line being connected with a drain of the corresponding second transistor.

4. The ferroelectric memory of claim 3, wherein the first bit line and the second bit line are connected with column select controller and sensing amplifier and therefrom transfer data in both read and write modes.

5. The ferroelectric memory of claim 3, wherein cell selected by corresponding first and second split word lines operates in the write mode and nonselected cell on the same corresponding first and second split word lines operates in the read mode, and therefore the nonselected cell is in a restore operation.

6. The ferroelectric memory of claim 3, wherein when the ferroelectric memory is in the write mode, corresponding first and second ferroelectric capacitors are polarized in the same polarization as the first and second bit lines, respectively, and when the ferroelectric memory is in the read mode, the corresponding first and second ferroelectric capacitors are restored in the same polarization as the first and second bit lines, respectively.

7. The ferroelectric memory of claim 3, wherein a corresponding first bit line and a corresponding second bit line are in connection with a corresponding sense amplifier to read and write one data.

8. The ferroelectric memory of claim 3, wherein a corresponding first bit line is coupled to a corresponding first sense amplifier and a corresponding second bit line is coupled to a corresponding second sense amplifier such that a data is written and read through each of the corresponding first bit line and corresponding second bit line.

9. A ferroelectric memory device, comprising:

first and second active regions defined by an isolation region in a substrate;

first and second gate lines being selectively formed in the first and second active regions, respectively;

first and second capacitors being separately formed on corresponding portions of the isolation region, each of said first and second capacitors having a lower electrode, an upper electrode and a ferroelectric layer formed therebetween, wherein the lower electrode of said first capacitor is coupled to said second gate line and the lower electrode of said second capacitor is coupled to said first gate line;

first and second source/drain regions formed on both sides of said first and second gate lines, respectively, wherein one of said first source/drain region is coupled to the upper electrode of said first capacitor and one of said second source/drain regions is coupled to the upper electrode of said second capacitor; and first and second conductive line layers being coupled to the other first and second source/drain regions, respectively.

10. A nonvolatile ferroelectric memory of the type having a plurality of memory cells arranged in rows and columns, each column comprising first and second bit lines coupled to memory cells along the column, each memory cell comprising first ferroelectric capacitors, each having first and second electrodes, a polarization of the first and second capacitors corresponding to the data stored therewithin, the improvement wherein:

the nonvolatile memory further comprises a plurality of first and second split word lines distinct from each other, each of the memory cells along a row being coupled to a first split word line and a second split word line corresponding to the row, the first split word line being coupled to the first electrodes of the second ferroelectric capacitors in the row and the second split word line being coupled to the first electrodes of the first ferroelectric capacitors in the row, each memory cell further including first and second switching devices located within the memory cell, said second electrode of said first capacitor in said memory cell being coupled to its corresponding first bit line via said first switching device, said second electrode of said second capacitor in said memory cell being coupled to its corresponding second bit line via said second switching device, said first switching device being coupled to be controlled by said corresponding first split word line and said second switching device being coupled to be controlled by said corresponding second split word line.

11. The memory of claim 10, further comprising for each first bit line, a first sense amplifier coupled to said first bit line and for each second bit line, a second sense amplifier coupled to said second bit line.

12. The memory of claim 11, wherein said first and second switching devices of each memory cell comprise first and second transistors, respectively, a gate electrode of the first transistor coupled to said first split word line in the row and a gate electrode of the second transistor coupled to said second split word line in the row.

13. The memory of claim 10, wherein said first switching device comprises a first field effect transistor having a gate electrode coupled to be controlled by said first split word line, and said second switching device comprises a second field effect transistor having a gate electrode coupled to be controlled by said second split word line.

14. The memory of claim 10, further including a word line driver, said first and second split word lines being coupled to said word line driver.

15. The memory of claim 10, further comprising a sense amplifier coupled to said first and second bit lines in each column.

16. A ferroelectric memory comprising:

a plurality of ferroelectric memory cells arranged in rows and columns, each row corresponding to first and second word lines, each column corresponding to first and second complementary, bit lines coupled to a respective amplifier, wherein each memory cell comprises first and second ferroelectric capacitors, each said capacitor having first and second electrodes, the second electrode of said first capacitor coupled selectively to said first bit line, and the second electrode of said second capacitor coupled selectively to said second bit line, and each said memory cell further includes first and second access transistors, a control electrode of the first access transistor being coupled to said corresponding first word line and a control electrode of the second access transistor being coupled to said corresponding second word line, said first and second access transistors being coupled respectively to the second electrodes of said first and second ferroelectric capacitors, said first and second transistors being selectively actuable to couple said second electrodes of said first and second capacitors to said first and second bit lines associated with said memory cell in response to first and second gate voltages on said first and second word lines, respectively;

said sense amplifier being responsive to a difference in voltage between said first and second bit lines, wherein the first electrode of the first capacitor is coupled to the second word line and the first electrode of the second capacitor is coupled to the first word line.

17. The memory of claim 16, wherein each said sense amplifier is responsive to a difference in voltages between said first and second bit lines to drive one of said bit lines to a first voltage and to maintain the other bit line at a reference voltage.

18. The memory according to claim 16, wherein said first and second word lines are parallel to each other.

19. A nonvolatile ferroelectric memory comprising:

an array of memory cells organized into rows and columns;

each column including a pair of bit lines;

a plurality of first word lines and second word lines, each of said first and second word lines coupled to a corresponding row of memory cells, each of said first and second word lines being distinct from each other, wherein each memory cell comprises first and second ferroelectric capacitors coupled to said first and second word lines, respectively, first and second transistors located within the memory cell and said first transistor coupled to said first word line, said first capacitor and a respective bit line so that said first capacitor can be coupled selectively to a corresponding said bit line, and said second transistor coupled to said second word line, said second capacitor and a respective bit line so that said second capacitor can be coupled selectively to a corresponding said bit line; and word line driver for applying first and second signal to a selected first and second word lines in a row, respectively, to polarize one of said capacitors.

20. The memory according to claim 19, wherein said first and second word lines are parallel to each other.

21. The memory according to claim 19, wherein each column includes one of
a) a first sense amplifier coupled to one of the pair of bit lines and a second sense amplifier coupled to another one of the pair of bit lines in the column, and
b) a sense amplifier coupled to the pair of bit lines in the column.

22. A nonvolatile ferroelectric memory comprising an array of memory cells arranged in rows and columns, each memory cell comprising first and second capacitors and each employing ferroelectric material therein, each column including:

a pair of complementary bit lines, first and second transistors responsively coupled to first and second word lines, said first and second transistors being located within each memory cell and operable for coupling said first and second capacitors of said memory cell to the pair of complementary bit lines, and a sense amplifier, coupled to said pair of bit lines, for driving said bit lines in accordance with the data content of said memory cell and for restoring the polarization of said memory cell capacitors.

23. The memory of claim 22, wherein said sense amplifier is coupled to maintain a voltage on said bit lines after data from said memory cell has been read thereby to restore one of said capacitors.

24. A method of operating a nonvolatile semiconductor memory comprising the steps of:

storing complementary data in a memory cell having first and second ferroelectric capacitors coupled to first and second transistors, respectively, said storing step including polarizing said first and second capacitors in accordance with the data;

coupling said first and second capacitors to a pair of bit lines via said first and second transistors coupled to first and second word lines, respectively;

applying a first signal across said capacitors until one said capacitor changes polarization, said applying step including controlling the voltage on the first and second word line coupled to said second capacitor;

sensing said change of polarization, and driving said bit line pair in accordance with the data in said cell; and thereafter restoring said capacitors to their original polarization states by applying a voltage transition via one of said first and second word lines to said first and second capacitors respectively while said bit lines are in a condition corresponding to the data sensed in the preceding step.

25. A ferroelectric memory comprising:

an array of memory cells arranged in rows and columns, each said row corresponding to first and second word lines, and each said column corresponding to first and second bit lines, a sense amplifier coupled to one of each of said first and second bit lines, and both of said first and second bit lines;

each memory cell comprising first and second ferroelectric capacitors, each having first and second electrodes and first and second transistors located within said cell for coupling said second electrodes of said first and second ferroelectric capacitors to the corresponding said first and second bit lines, respectively;

said first and second word lines being coupled to control electrodes of first and second transistors, respectively; and said first word line coupled to the first electrode of said second ferroelectric capacitor and said second word line coupled to the first electrode of the first ferroelectric capacitor, said first and second word lines in the row being distinct from each other.

26. The memory of claim 25, wherein the control electrodes of first and second transistors comprise a gate electrode of a field effect transistor.

27. A method of operating an array of memory units organized into row and columns, each row having a first word line and a second word line and each column having a first bit line and a second bit line and each memory unit having a first transistor coupled to the first word and bit lines and coupled to a first ferroelectric capacitor having first and second electrode, where the first electrode is coupled to the second word line, and a second transistor coupled to the second word and bit lines and coupled to second ferroelectric capacitor having first and second electrodes, where the first electrode is coupled to the first word line, the method comprising the steps of:

applying first and second non-zero voltages to said first and second word lines, respectively, along a first row corresponding in the selected memory unit for turning on the first and second transistors thereby coupling the second electrode of the first ferroelectric capacitor to the first bit line and the second electrode of the second ferroelectric capacitor to the second bit line during a first time interval;

applying a first zero voltage to the first word line to turn off the first transistors of the memory unit in the selected row while the second transistors in the selected row are turned on by the second non-zero voltage during a second time interval; and applying a third non-zero voltage to the first word line to turn on the first transistors of the memory units in the selected row while the second transistors in the selected row are turned off by applying a second zero voltage to the second word line during a third time interval.

28. The method of claim 27 further comprising the step of applying a same voltage on the selected first and second word lines for turning off the first and second transistors in the row during a fourth time interval.

29. The method of claim 27 further comprising the step of applying first and second prescribed voltages to the first and second bit lines in the selected column to polarize said first ferroelectric capacitor to a first polarization state and said second ferroelectric capacitor to a second polarization state, where the first and second polarization states correspond to two binary logic levels.

30. The method of claim 27 further comprising the step of comparing a first signal and a second signal developed on the first bit line and the second bit line in a selected column, respectively, to determine a logic state of the data stored in the selected memory unit.

31. The method of claim 27 further comprising the steps of:

applying first and second prescribed voltages to the first and second bit lines in a first column to polarize said first ferroelectric capacitor to a first polarization state and said second ferroelectric capacitor to a second polarization state, where the first and second polarization states correspond to two binary logic levels; and comparing a first signal and a second signal developed on the first bit line and the second bit line in a second column, respectively, to determine a logic state of the data stored in a corresponding memory unit.

32. The method of claim 27, further comprising the steps of:

polarizing the first and second ferroelectric capacitors of the memory unit in the selected row and a first column to first and second polarization states corresponding to two binary logic levels;

reading the two binary logic levels of first and second ferroelectric capacitor of the memory unit in the selected row and a second column during the first time interval;

restoring one of the first and second polarization states, respectively, in one of said first and second ferroelectric capacitors in the selected row and the second column during one of the second and third time intervals, respectively.

33. The method of claim 32, wherein the reading step further comprises restoring one of the first and second polarization states, respectively, in one of said first and second ferroelectric capacitors in the selected row and the second column during the first time interval.

* * * * *